(12) United States Patent
Popp et al.

(10) Patent No.: US 9,508,790 B2
(45) Date of Patent: Nov. 29, 2016

(54) TRENCH CAPACITORS AND METHODS OF FORMING THE SAME

(71) Applicant: Infineon Technologies AG, Neubiberg (DE)

(72) Inventors: Thomas Popp, Falkenstein/Gfaell (DE); Stefan Pompl, Landshut (DE); Rudolf Berger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/724,437

(22) Filed: May 28, 2015

(65) Prior Publication Data

US 2015/0263083 A1 Sep. 17, 2015

Related U.S. Application Data

(62) Division of application No. 13/405,092, filed on Feb. 24, 2012, now Pat. No. 9,111,781.

(51) Int. Cl.
*H01L 49/02* (2006.01)
*H01L 27/08* (2006.01)

(52) U.S. Cl.
CPC .......... *H01L 28/90* (2013.01); *H01L 27/0805* (2013.01)

(58) Field of Classification Search
USPC ....................................................... 257/532
See application file for complete search history.

(56) References Cited

U.S. PATENT DOCUMENTS

| | | | |
|---|---|---|---|
| 5,555,520 A * | 9/1996 | Sudo | H01L 27/10829 257/301 |
| 6,251,722 B1 | 6/2001 | Wei et al. | |
| 6,930,345 B2 | 8/2005 | Short | |
| 7,030,457 B2 | 4/2006 | Ahrens et al. | |
| 7,375,413 B2 | 5/2008 | Cheng et al. | |
| 7,560,360 B2 | 7/2009 | Cheng et al. | |
| 7,800,184 B2 | 9/2010 | Voldman | |
| 2002/0163842 A1 * | 11/2002 | Benzinger | H01L 27/10867 365/200 |
| 2002/0167045 A1 | 11/2002 | Short | |
| 2005/0048715 A1 | 3/2005 | Rupp et al. | |
| 2007/0200178 A1 | 8/2007 | Yun et al. | |
| 2007/0235801 A1 | 10/2007 | Cheng et al. | |
| 2007/0272963 A1 | 11/2007 | Kishida | |

(Continued)

FOREIGN PATENT DOCUMENTS

| CN | 101410988 A | 4/2009 |
|---|---|---|
| DE | 10220129 A1 | 11/2002 |

(Continued)

OTHER PUBLICATIONS

"Chemical etching of Si/sub 1-x/Ge/sub x/ in HF:H/s," Journal of the Electrochemical Society, vol. 142, No. 4, Apr. 1995, 8 pages.

*Primary Examiner* — Zandra Smith
*Assistant Examiner* — Lawrence Tynes, Jr.
(74) *Attorney, Agent, or Firm* — Slater Matsil, LLP

(57) ABSTRACT

A method of forming a semiconductor device includes forming an opening having a sidewall in a substrate and forming a first epitaxial layer in the opening. The first epitaxial layer is formed in a first portion of the sidewall without growing in a second portion of the sidewall. A second epitaxial layer is formed in the opening after forming the first epitaxial layer. The second epitaxial layer is formed in the second portion of the sidewall. The first epitaxial layer is removed after forming the second epitaxial layer.

21 Claims, 21 Drawing Sheets

(56) References Cited

U.S. PATENT DOCUMENTS

2007/0273000 A1* 11/2007 Cheng ............... H01L 29/66181
                                                        257/499
2009/0020764 A1   1/2009 Anderson et al.
2011/0073990 A1   3/2011 Berger et al.

FOREIGN PATENT DOCUMENTS

| DE | 102005026228 A1 | 2/2006 |
| WO | 2007137946 A2 | 12/2007 |

* cited by examiner

TRENCH CAPACITORS AND METHODS OF FORMING THE SAME

This application is a divisional of application Ser. No. 13/405,092, filed on Feb. 24, 2012, which is incorporated herein by reference.

TECHNICAL FIELD

The present invention relates generally to capacitors, and more particularly to trench capacitors and methods of forming the same.

BACKGROUND

Semiconductor devices with capacitors are commonly used in many applications. Each capacitor has two electrodes separated by an insulating layer. Such capacitors may be stacked capacitors, metal-insulator-metal (MIM) capacitors, trench capacitors and vertical-parallel-plate (VPP) capacitors.

Trench capacitors are used to increase the capacitance per unit area. However, the figure of merit of semiconductor devices including capacitors has to increase with every generation of semiconductor technology. One way to improve capacitors is by increasing the capacitance per unit area further so that deeply scaled device may be fabricated. The capacitance per unit area can be increased by increasing the trench depth, but the maximum trench depth is limited for technical reasons. Therefore, new capacitor structures and methods of manufacturing are necessary to increase capacitance without compromising other requirements.

SUMMARY OF THE INVENTION

These and other problems are generally solved or circumvented, and technical advantages are generally achieved, by illustrative embodiments of the present invention.

In accordance with an embodiment of the present invention, a semiconductor device comprises a substrate having an opening with a first sidewall and a central pillar disposed in a central region of the opening. The central pillar includes a first electrode material. A first dielectric layer is disposed around the central pillar. A second electrode material is disposed around the first dielectric layer. The second electrode material contacts a first portion of the first sidewall. A peripheral pillar is disposed in a periphery region of the opening. The peripheral pillar is coupled to the central pillar. A second dielectric layer is disposed around the peripheral pillar. The second dielectric layer contacts a second portion of the first sidewall.

In accordance with an embodiment of the present invention, a method of forming a semiconductor device includes forming an opening in a substrate and forming a first epitaxial layer in the opening. The first epitaxial layer is a different material from material of the substrate at a sidewall of the opening. A second epitaxial layer is formed in the opening. The second epitaxial layer is the same material as the substrate at the sidewall of the opening. The first epitaxial layer is removed. The second epitaxial layer is lined with a dielectric layer. A conductive material is formed over the dielectric layer. The conductive material, the second epitaxial layer, and the dielectric layer form parts of a trench capacitor.

In accordance with an embodiment of the present invention, a method of forming a semiconductor device includes forming an opening having a sidewall in a substrate and forming a first epitaxial layer in the opening. The first epitaxial layer is formed in a first portion of the sidewall without forming in a second portion of the sidewall. A second epitaxial layer is formed in the opening after forming the first epitaxial layer. The second epitaxial layer is formed in the second portion of the sidewall and above the first epitaxial layer. The first epitaxial layer is removed after forming the second epitaxial layer.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a capacitor in accordance with an embodiment of the invention, wherein FIG. 1A illustrates a top sectional view, and wherein FIGS. 1B and 1C illustrate cross-sectional views;

FIG. 2, which includes FIGS. 2A-2C, illustrates a semiconductor structure after formation of openings for the capacitor in accordance with embodiments of the invention, wherein FIG. 2A illustrates a top view, FIG. 2B illustrates a cross-sectional view, and FIG. 2C illustrates a projection view;

FIG. 3, which includes FIGS. 3A-3D, illustrates the semiconductor device during fabrication after forming an epitaxial layer in accordance with embodiments of the invention, wherein FIG. 3A illustrates a top view, wherein FIGS. 3A and 3B illustrate cross-sectional views, and FIG. 3D illustrates a projection view;

FIG. 4, which includes FIGS. 4A-4E, illustrates the semiconductor device during fabrication after forming a first electrode of the capacitor in various embodiments of the invention, wherein FIG. 4A illustrates a top view, wherein FIGS. 4B and 4C illustrate cross-sectional views, and FIG. 4D illustrates a projection view, and wherein FIG. 4E illustrates a top view in accordance with an alternative embodiment;

FIG. 5, which includes FIGS. 5A-5D, illustrates the semiconductor device during fabrication after removing epitaxial layer in various embodiments of the invention, wherein FIG. 5A illustrates a top view, wherein FIGS. 5B and 5C illustrate cross-sectional views, and FIG. 5D illustrates a projection view;

FIG. 6, which includes FIGS. 6A-6C, illustrates the semiconductor device during fabrication after forming a capacitor dielectric layer in various embodiments of the invention, wherein FIG. 6A illustrates a top view, wherein FIGS. 6B and 6C illustrate cross-sectional views;

FIG. 7, which includes FIGS. 7A-7C, illustrates the semiconductor device during fabrication after forming a second electrode over the capacitor dielectric layer in various embodiments of the invention, wherein FIG. 7A illustrates a cross-section parallel to the surface of the substrate, below the covering second electrode, wherein FIGS. 7B and 7C illustrate cross-sectional views;

FIG. 8, which includes

FIG. 9, which includes FIGS. 9A-9C, illustrates an alternative embodiment of the invention showing a plurality of capacitor structures formed adjacent each other, wherein FIG. 9A illustrates a top view and FIGS. 9B and 9C illustrate cross-sectional views;

FIG. 10, which includes FIGS. 10A-10C, illustrates an embodiment of the invention with an additional protective layer, wherein FIG. 10A illustrates a top view, and FIGS. 10B and 10C illustrate cross-sectional views;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of a trench capacitor will be described using FIG. 1. Alternative structural embodiments will be described using FIGS. 8, 9, 10, and 11. A method of fabricating a trench capacitor will be described using FIGS. 2-7. An alternative method of fabricating the trench capacitor will be described using FIG. 8, FIGS. 12-13, and FIG. 14.

Figure 1A:
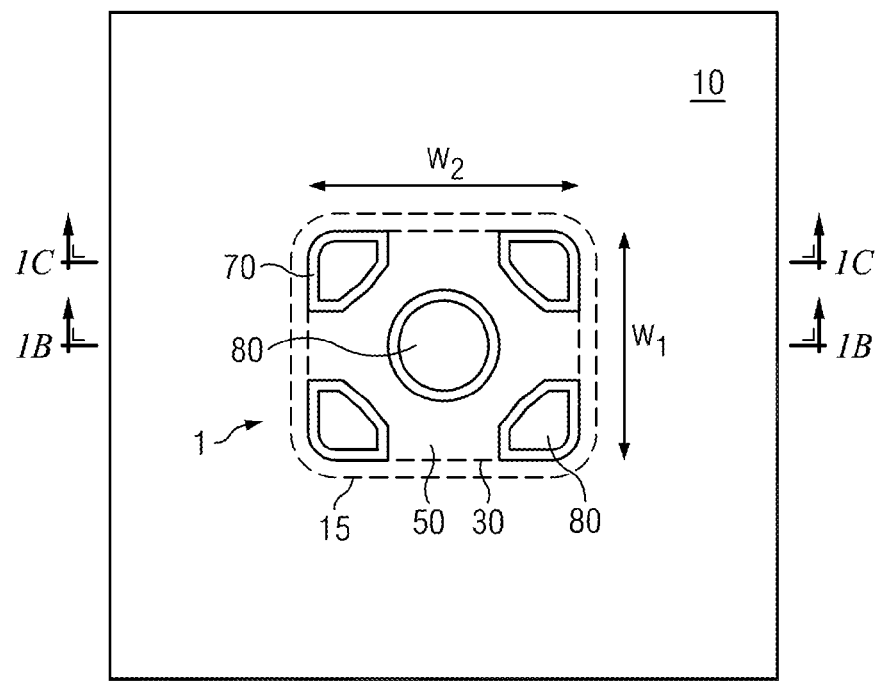
Figure 1B:
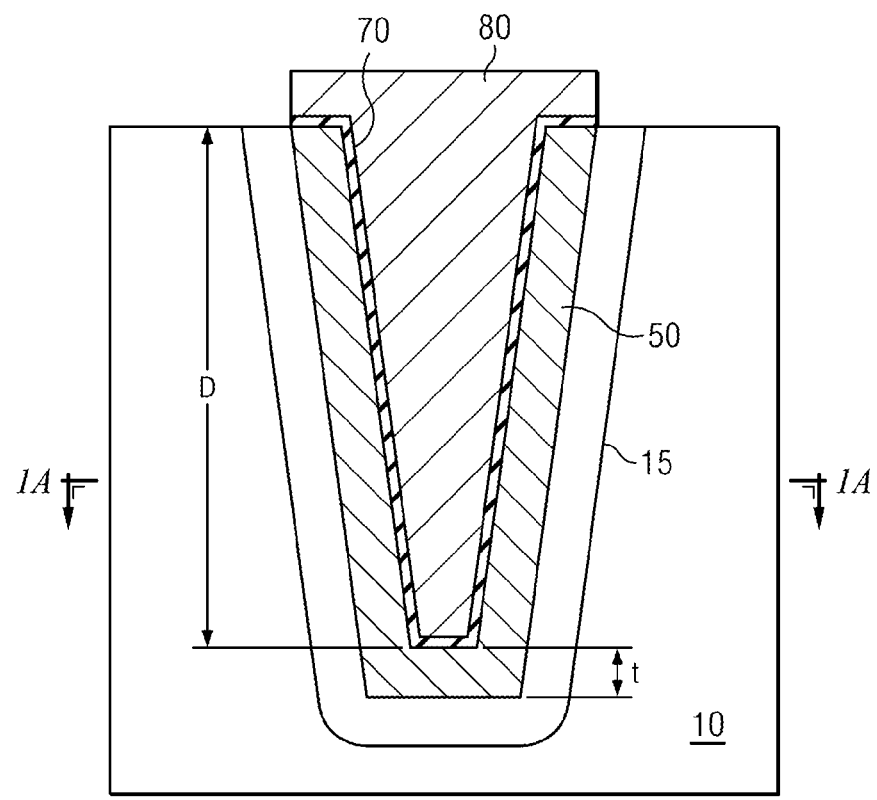
Figure 1C:
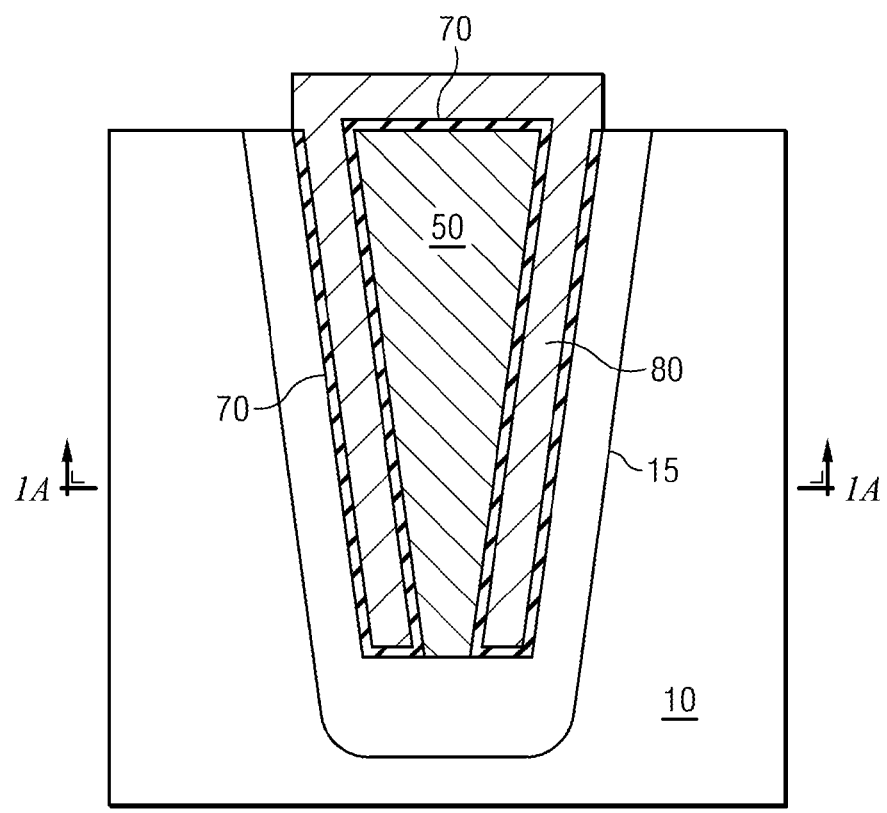

FIG. 1, which includes FIGS. 1A-1C, illustrates a capacitor in accordance with an embodiment of the invention, wherein FIG. 1A illustrates a top sectional view, and wherein FIGS. 1B and 1C illustrate cross-sectional views.

Referring to FIG. 1A, a trench capacitor 1 is disposed within an opening 30 in a substrate 10. The substrate 10 may be silicon, for example, bulk mono-crystalline silicon substrate, in one embodiment. In one or more embodiments, the substrate 10 may be a silicon-on-insulator (SOI) substrate. The SOI substrate may, for example, be formed by a SIMOX process. The substrate 10 may be doped either p-type or n-type in various embodiments. In one or more embodiments, the substrate 10 is a p-type semiconductor substrate.

In other embodiments, the substrate 10 may be silicon alloys and compound semiconductors. In some embodiments, the substrate 10 may be an III-V substrate with elements from Group III and Group V, or the substrate 10 may be an II-VI substrate with elements from Group II and Group VI. In one or more embodiments, the substrate 10 may be a silicon-on-sapphire (SOS) substrate. In one or more embodiments, the substrate 10 may be a germanium-on-insulator (GeOI) substrate. In one or more embodiments, the substrate 10 may include one or more semiconductor materials such as silicon, silicon germanium, germanium, gallium arsenide, indium arsenide, indium arsenide, gallium nitride, indium gallium arsenide, or indium antimonide.

The opening 30 may be formed as a hole or a trench. The opening 30 may have a first width $W_1$ and a second width $W_2$. In one embodiment, the first width $W_1$ is about the same as the second width $W_2$ as in a hole. However, in another embodiment, the first width $W_1$ may be different from the second width $W_2$. For example, the first width $W_1$ may be much larger than the second width $W_2$ thereby forming a trench. In one or more embodiments, the first width $W_1$ is about 2 μm or less, and about 1 μm to about 2 μm in one embodiment while the second width $W_2$ is about 2 μm or less, and about 1 μm to about 2 μm in one embodiment. In one embodiment the opening has a circular form.

In various embodiments, the opening 30 is deep, for example, with an aspect ratio (ratio of narrower width to depth) of more than 10. The depth "D" of the opening 30 (FIG. 1B) is less than about 50 μm and about 10 μm to about 30 μm in one embodiment. In some embodiments, the depth "D" of the opening 30 is more than about 30 μm.

In various embodiments, the opening 30 has inclined sidewalls. For example, the sidewalls may be oriented along crystallographic orientations of the substrate 10. In one embodiment, the sidewalls are in {100} planes. In another embodiment, the sidewalls are in {110} planes. The sidewalls of the opening 30 may be doped, for example, may include a doped region 15.

As illustrated in FIGS. 1A and 1B, a network of a first conductive material 50 contacts a portion of the sidewall of the trench. In particular, the first conductive material 50 is disposed only in central regions of the sidewalls of the opening 30. The first conductive material 50 may cover the bottom surface of the opening 30 (FIG. 1B). In some embodiments, the first conductive material 50 may not cover the bottom surface of the opening 30. Rather, a conductive region of the substrate 10 is disposed under the bottom surface of the opening 30 for coupling the various parts of the first conductive material 50 laterally.

In various embodiments, the first conductive material 50 comprises an epitaxially grown material. Alternatively, the first conductive material 50 may be a deposited film using other techniques. In various embodiments, the first conductive material 50 comprises the same material as the substrate 10. However, the first conductive material 50 may comprise a different amount of doping than the substrate 10. For example, the first conductive material 50 may be doped to a higher doping than the substrate 10 to increase the capacitance. Further, in some embodiments, the first conductive material 50 may be doped to an opposite type of doping type than the substrate 10, for example, to isolate the first conductive material 50 from the substrate 10. In various embodiments, the first conductive material 50 comprises silicon. In various embodiments, the first conductive material 50 comprises other materials including GaN, InSb, GaAs, SiC etc.

In one or more embodiments, the thickness "t" of the first conductive material 50 is about 50 nm or less, and about 20 nm to about 50 nm in one embodiment. In one or more embodiments, the thickness "t" of the first conductive material 50 is about 10 nm to about 30 nm in one embodiment. However, in various embodiments, the thickness "t" of the first conductive material 50 may not be uniform along the sidewalls of the opening 30. Rather, due to the epitaxial nature of the deposition and the deep aspect ratio of the opening 30, the thickness "t" of the first conductive material 50 may reduce along the vertical direction, i.e., going deeper into the substrate. Further, in some embodiments, depending on the nature of the epitaxial process, the first conductive material 50 may not grow on the bottom surface of the opening 30.

A dielectric layer 70 is disposed over the first conductive material 50. The dielectric layer 70 may comprise any suitable dielectric and may be an oxide such as silicon oxide, nitride such as silicon nitride, oxynitride such as silicon oxynitride, or mixtures thereof. The dielectric layer 70 may also comprise a high-k material in one embodiment.

Further, a central portion of the opening 30 is not filled with the first conductive material 50. Rather, the central portion of the opening 30 is filled with a second conductive material 80. The first and the second conductive materials 50 and 80 are separated by the dielectric layer 70. The dielectric layer 70 functions as the capacitor dielectric and capacitively couples the first conductive material 50 with the second conductive material 80.

In various embodiments, the second conductive material 80 may be a deposited material. The second conductive material 80 may comprise the same material as or a different material from the substrate 10. In various embodiments, the second conductive material 80 comprises silicon, and in one embodiment the second conductive material 80 is polysilicon, for example, doped p-type or n-type. In various embodiments, the second conductive material 80 comprises other materials including metal silicides such as titanium silicide, nickel silicide, cobalt silicide, tungsten silicide, molybdenum silicide, nitrides such as titanium nitride, tantalum nitride, tungsten nitride or carbides such as tantalum carbide, titanium carbide or tungsten carbide metallic materials such as graphene, titanium, tungsten, tantalum, molybdenum, aluminum, copper, and combinations thereof.

In various embodiments, the first conductive material 50 forms the first electrode of a capacitor 1, the second conductive material 80 forms the second electrode of the capacitor 1, and the dielectric layer 70 forms the capacitor dielectric. The second conductive material 80 overfills the opening 30 in one embodiment to facilitate contact formation. However, the second conductive material 80 does not contact the substrate 10 to avoid shorting of the capacitor 1.

As illustrated in FIG. 1C, the first conductive material 50 is capacitively coupled to the second conductive material 80 both laterally along the opening 30 and vertically.

A method of fabricating the trench capacitor will be described using FIGS. 2-7 in accordance with embodiments of the invention.

Figure 2A:
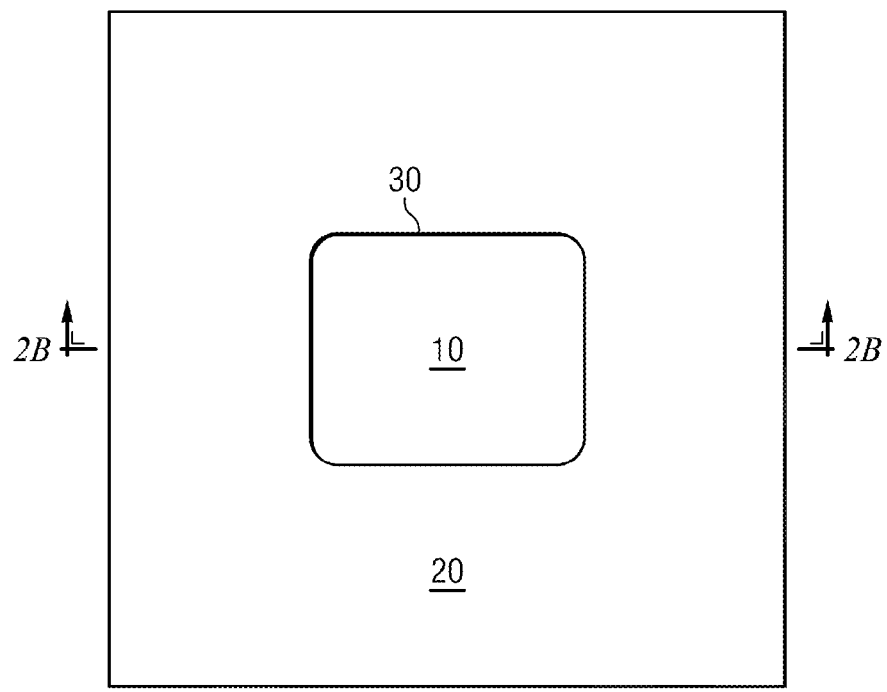
Figure 2B:
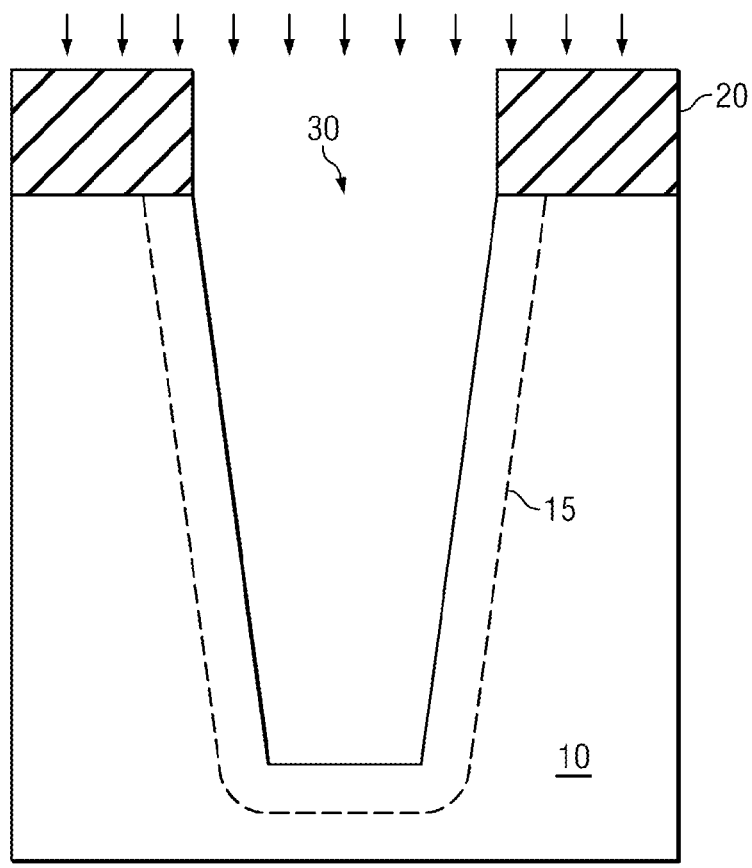
Figure 2C:
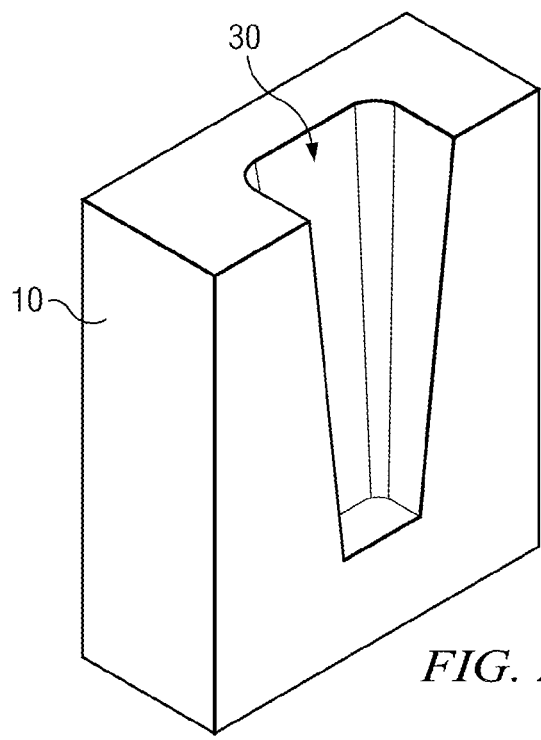

FIG. 2, which includes FIGS. 2A-2C, illustrates a semiconductor structure after formation of openings for the capacitor in accordance with embodiments of the invention, wherein FIG. 2A illustrates a top view, FIG. 2B illustrates a cross-sectional view, and FIG. 2C illustrates a projection view.

An opening 30 is formed in the substrate 10 by patterning a hard mask and etching the substrate 10. A hard mask layer 20 is formed over the substrate 10. The hard mask layer 20 may comprise a plurality of layers. In one embodiment, the hard mask layer 20 comprises silicon oxide, silicon nitride, or combinations thereof. The hard mask layer 20 is patterned to open an area of the substrate 10 for forming a trench, for example, using lithography.

In the embodiment illustrated in FIGS. 2B and 2C, the opening 30 goes only partially through the substrate 10. However, in another embodiment, the opening 30 may go totally through the substrate 10. The opening 30 may include a bottom surface and at least one sidewall surface (one or more sidewall surfaces). The bottom surface of the opening 30 may be formed over a conductive portion of the substrate 10.

As described previously, the sidewalls of the opening 30 may be oriented along crystallographic orientations of the substrate 10. For example, in one embodiment, the sidewalls of the opening 30 are oriented along <110> direction for a substrate having a (100) top surface. Alternatively, in another embodiment, the sidewalls of the opening 30 are oriented along <100> directions. As will be described subsequently, this helps to control the subsequent epitaxial processes.

FIG. 2C illustrates the projection view after the formation of the opening 30. As illustrated in FIGS. 2B and 2C, the width of the opening 30 may reduce going deeper into the substrate 10.

In various embodiments, the opening 30 may be formed using an anisotropic etching process. In one embodiment, a reactive ion etch process may be used to form the opening 30.

In one embodiment, after the formation of the opening 30, a region of the substrate 10 proximate to the opening 30 may be doped, for example, by ion-implantation. In various embodiments, the ion-implantation may be performed at an angle over multiple rotations so that both the bottom surface and sidewalls of the opening 30 are doped. A annealing may be performed to remove the implant damage and activate the dopants, which forms a doped region 15 in the substrate 10. This doped region 15 of the substrate 10 may be a portion of the first electrode of the capacitor structure being formed. Such doping may avoid increased resistance if subsequent growth of the first conductive layer 50 at the bottom surface of the opening 30 is difficult to control. In another embodiment, a dopant layer may be deposited within the opening 30. The dopant layer may comprise a dopant such as arsenic, phosphorus, or boron and may be an oxide in one embodiment. The deposited dopants from the dopant layer may then be diffused into the substrate by an annealing process. After the annealing process the dopant layer may be removed. This embodiment will be further described using FIGS. 12-13.

Figure 3A:
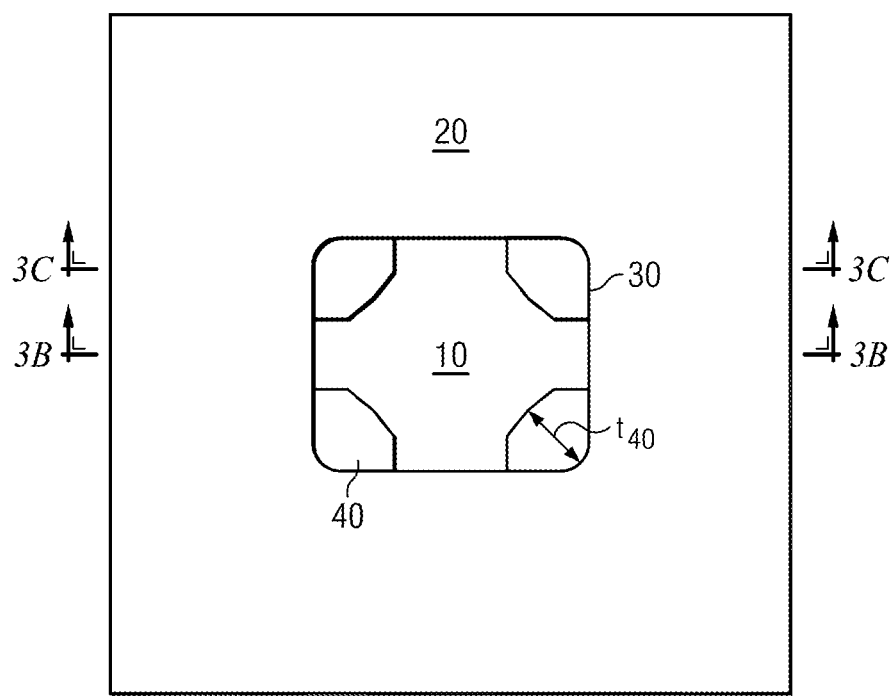
Figure 3B:
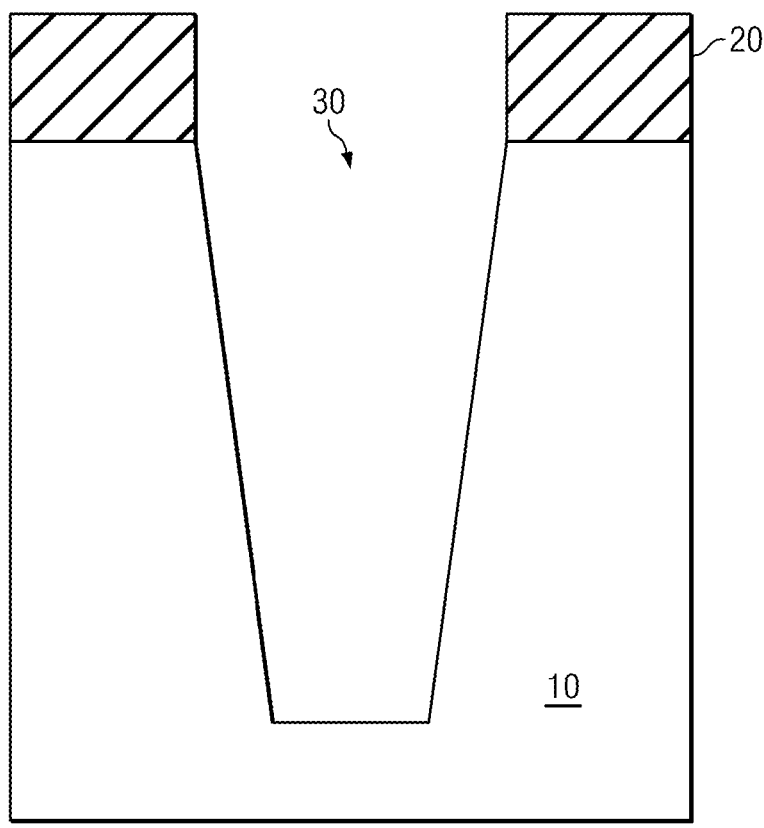
Figure 3C:
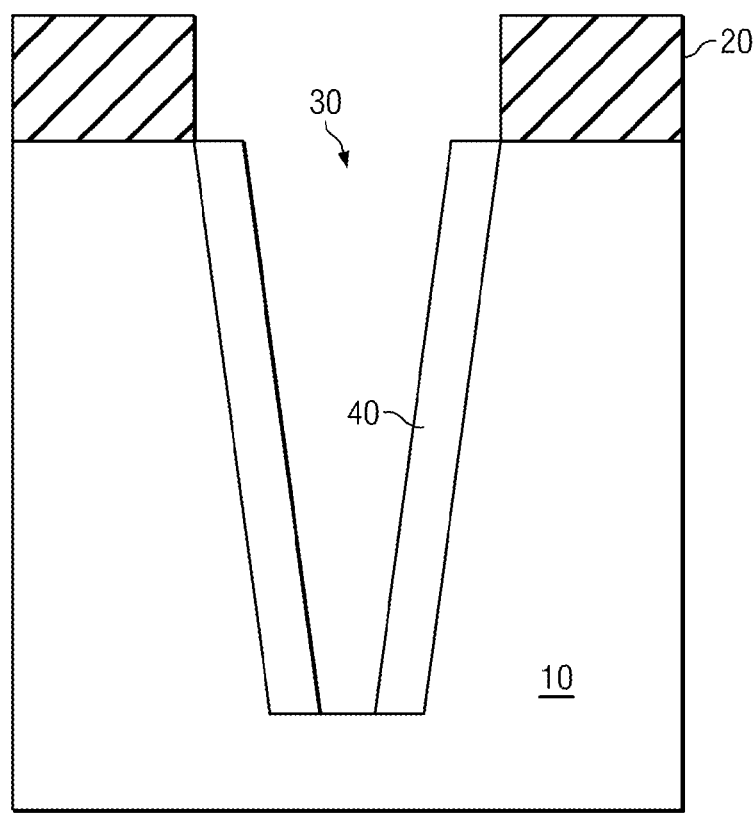
Figure 3D:
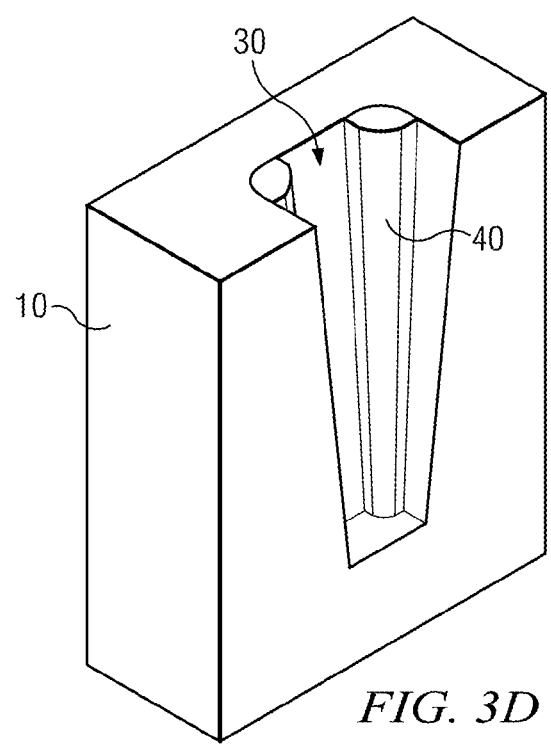

FIG. 3, which includes FIGS. 3A-3D, illustrates the semiconductor device during fabrication after forming an epitaxial layer in accordance with embodiments of the invention, wherein FIG. 3A illustrates a top view, wherein FIGS. 3A and 3B illustrate cross-sectional views, and FIG. 3D illustrates a projection view.

As illustrated in FIG. 3A, an epitaxial layer 40 is grown by exposing the opening 30 to a selective epitaxial process. In various embodiments, the epitaxial layer 40 comprises a different material from the substrate 10. In one embodiment, the epitaxial layer 40 may have a different lattice constant than the substrate 10 while having the same crystal structure as the substrate 10. For example, if the substrate 10 comprises silicon, the epitaxial layer 40 may be SiGe. In other embodiments, the epitaxial layer 40 may have a crystal structure from the substrate 10. For example, if the substrate 10 is silicon, then the epitaxial layer 40 may be GaN, InSb, GaAs, SiC, etc.

In various embodiments, the epitaxial layer 40 is faceted. Advantageously, the growth rate of an epitaxial layer 40 depends on the crystallographic planes. For example, the growth rate of the epitaxial layer 40 along {110}, {100}, {111} planes may be greatly different. For example, epitaxial silicon germanium may grow faster along {100} planes than {110} planes when the sidewalls of the opening 30 are oriented along <110> directions Further, the growth rates along different planes can be changed by changing the composition of the epitaxial layer 40, for example, changing the % of germanium in a SiGe alloy. In one embodiment, a silicon germanium alloy with about 25% to about 70% germanium is grown on the sidewalls of the opening 30. Therefore, the epitaxial layer 40 grows along preferred directions, which in the illustrated case are the corners. In various embodiments, the material of the epitaxial layer 40 is chosen so that the epitaxial layer 40 grows selectively only in partial regions of the sidewalls of the opening 30. However, in some embodiments, the epitaxial layer 40 may grow only from the central portion of the sidewalls (as will be described later using FIG. 8) and not the corners as illustrated here. In other embodiments the first epitaxial layer may grow on all parts of the sidewall as will be described in the alternative embodiment of FIG. 14.

In various embodiments, the epitaxial layer 40 has a thickness $t_{40}$ of about 100 nm to about 300 nm, and about 200 nm to about 250 nm in one embodiment, or in one embodiment less than about 100 nm. In various embodiments, the thickness $t_{40}$ of the epitaxial layer 40 is about 0.3 or less of the first width $W_1$, and about 0.2 of the first width $W_1$ to about 0.3 of the first width $W_1$ in one embodiment.

Figure 4A:
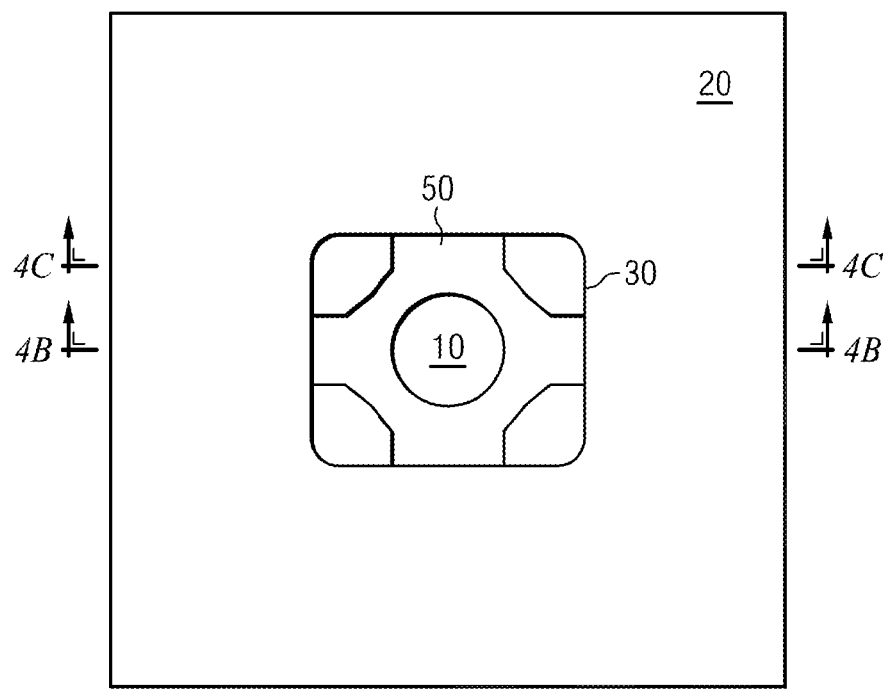
Figure 4B:
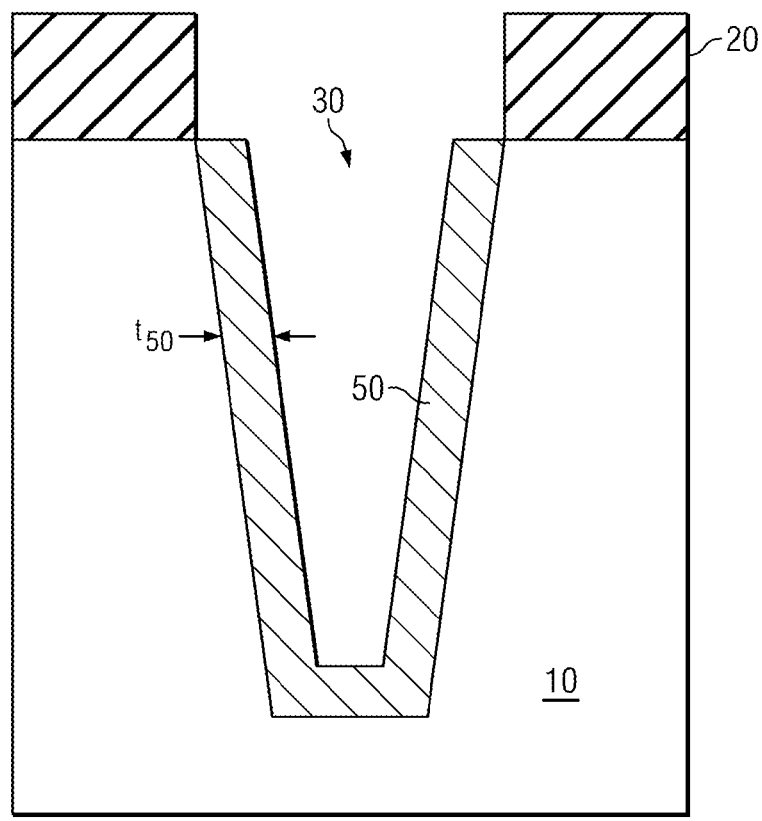
Figure 4C:
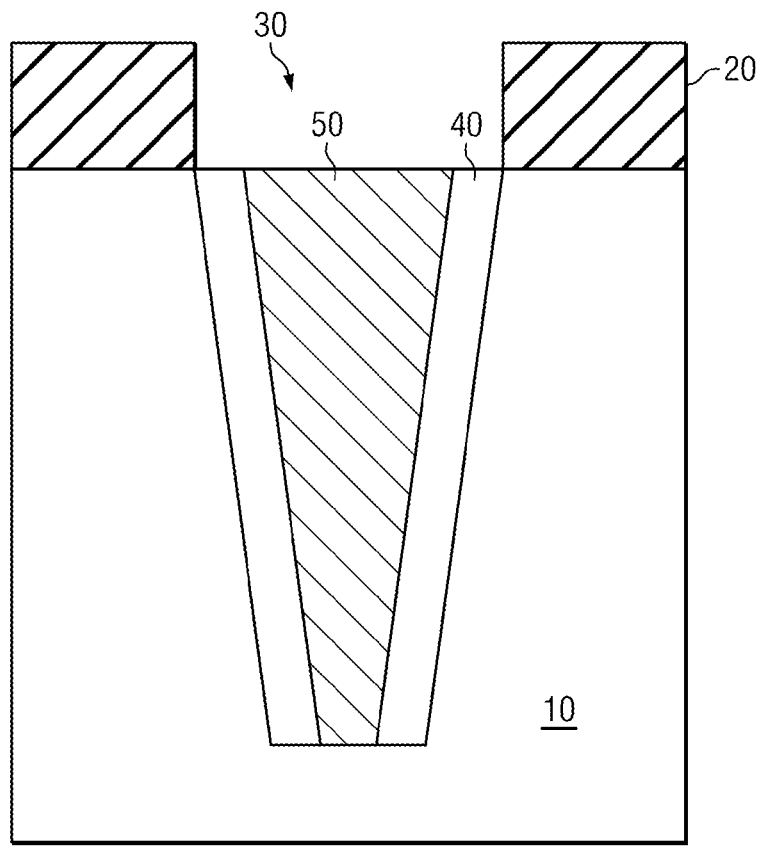
Figure 4D:
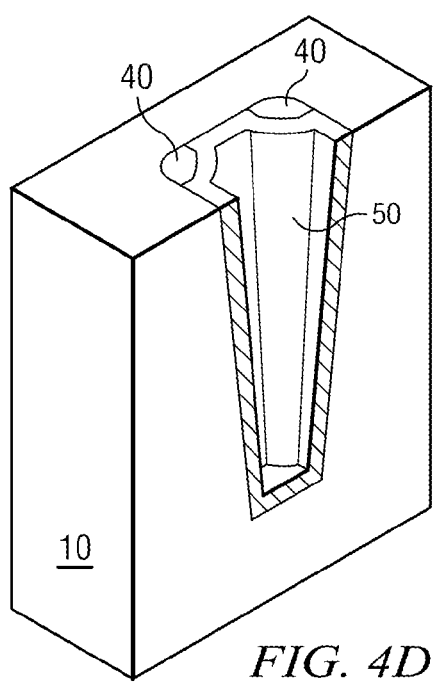
Figure 4E:
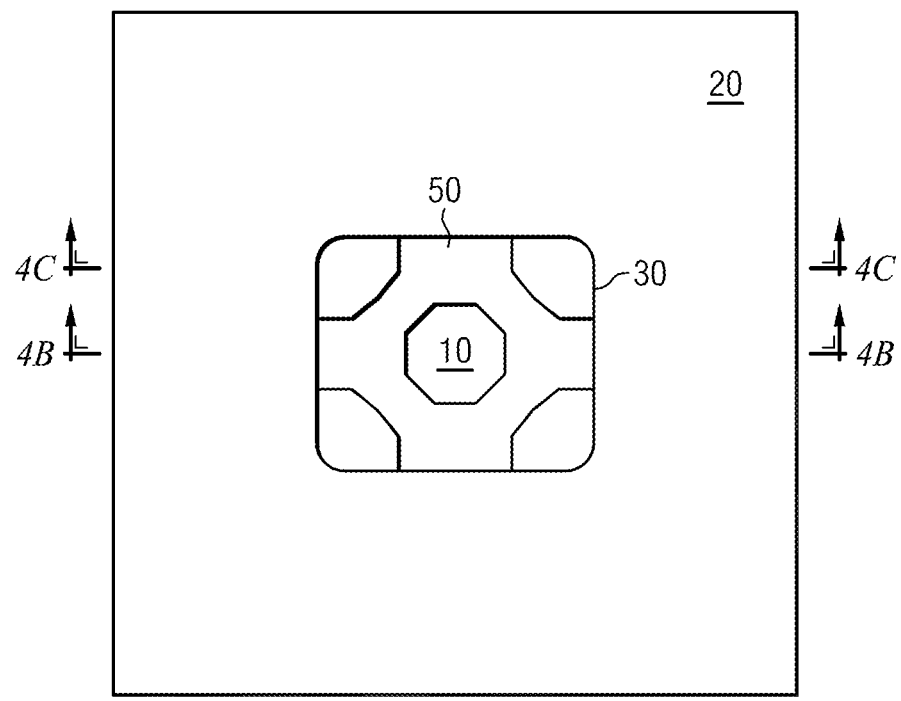

FIG. 4, which includes FIGS. 4A-4E, illustrates the semiconductor device during fabrication after forming a first electrode of the capacitor in various embodiments of the invention, wherein FIG. 4A illustrates a top view, wherein FIGS. 4B and 4C illustrate cross-sectional views, and FIG. 4D illustrates a projection view, and wherein FIG. 4E illustrates a top view in accordance with an alternative embodiment.

Next, a first conductive material 50 is conformally deposited within the opening 30. In one or more embodiments, another epitaxial material is grown within the opening 30 to form the first conductive material 50. In various embodiments, the first conductive material 50 grows over the exposed sidewalls of the epitaxial layer 40 (as shown in FIGS. 4A and 4C). The first conductive material 50 also grows over the remaining portions of the sidewalls of the opening 30, which are not covered by the epitaxial layer 40. As illustrated in FIGS. 4A and 4B, the first conductive material 50 grows on central portions of the sidewalls of the opening 30.

In various embodiments, the thickness $t_{50}$ of the first conductive material 50 on the sidewalls of the opening is about 100 nm to about 400 nm, and about 200 nm to about 300 nm. Further, the thickness $t_{50}$ of the first conductive material 50 on a top portion of the sidewalls may be greater than a bottom portion of the sidewalls, for example, by a factor of about 1.5 or more.

In one embodiment, the first conductive material 50 is the same as the substrate 10. Advantageously, the first conductive material 50 is chosen such that the growth rate of the first conductive material 50 is faster on the substrate 10 than the epitaxial layer 40. For example, when the substrate 10 is a silicon substrate and the epitaxial layer 40 is silicon germanium, a silicon epitaxial process may be used to form the first conductive material 50.

As illustrated in FIGS. 4A and 4B, the central portion is left unfilled with the first conductive material 50. The time for the deposition is controlled to ensure that the opening 30 is not completely filled. Although, the shape of the remaining central opening is circular in FIG. 4A, in various embodiments other shapes may be formed. This is because the exact shape depends on the growth of different crystal planes and therefore, a faceted (polygonal) shaped opening may be formed in the central region of the opening 30 rather than the circular shape illustrated. The faceted shape has sidewalls oriented along the preferred growth planes, i.e., planes having the faster growth rates. FIG. 4E illustrates such an embodiment having an octagonal shaped opening in the central portion of the opening 30.

In various embodiments, the first conductive material 50 may be in-situ doped, for example, during the epitaxial process. Alternatively, the first conductive material 50 may be doped by other methods such as ion-implantation.

Figure 5A:
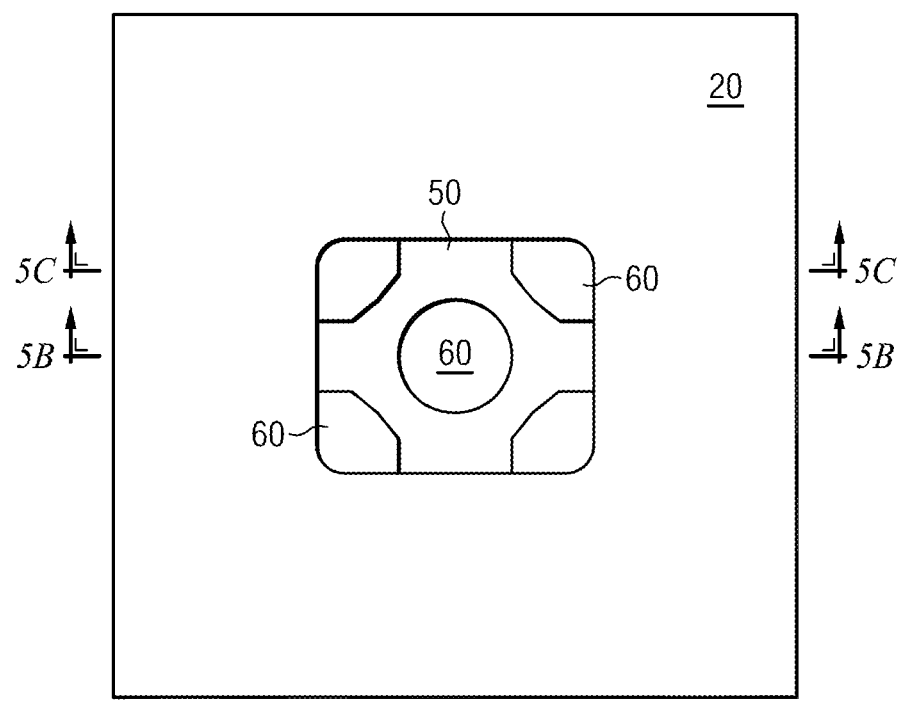
Figure 5B:
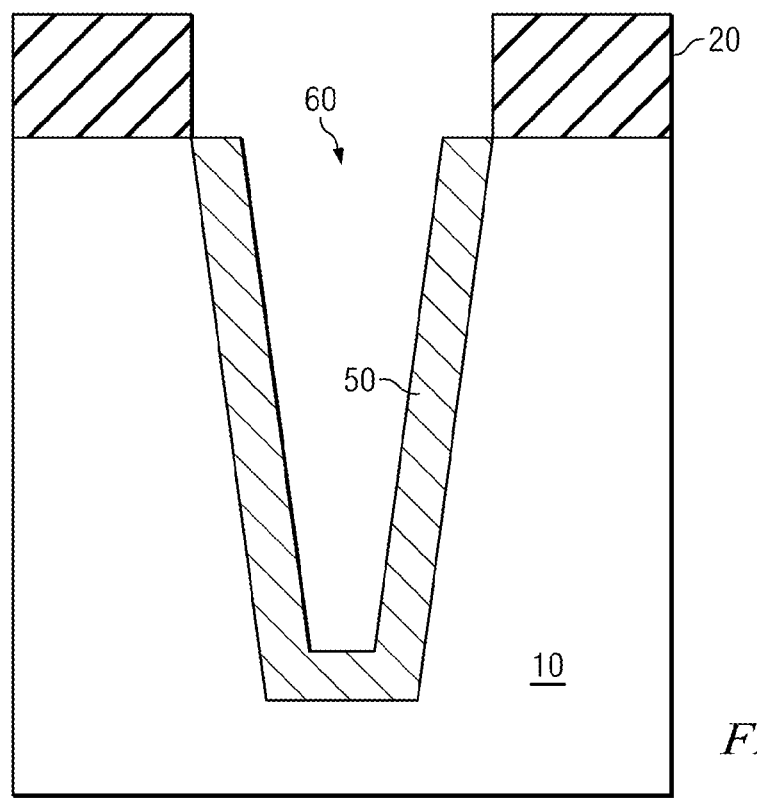
Figure 5C:
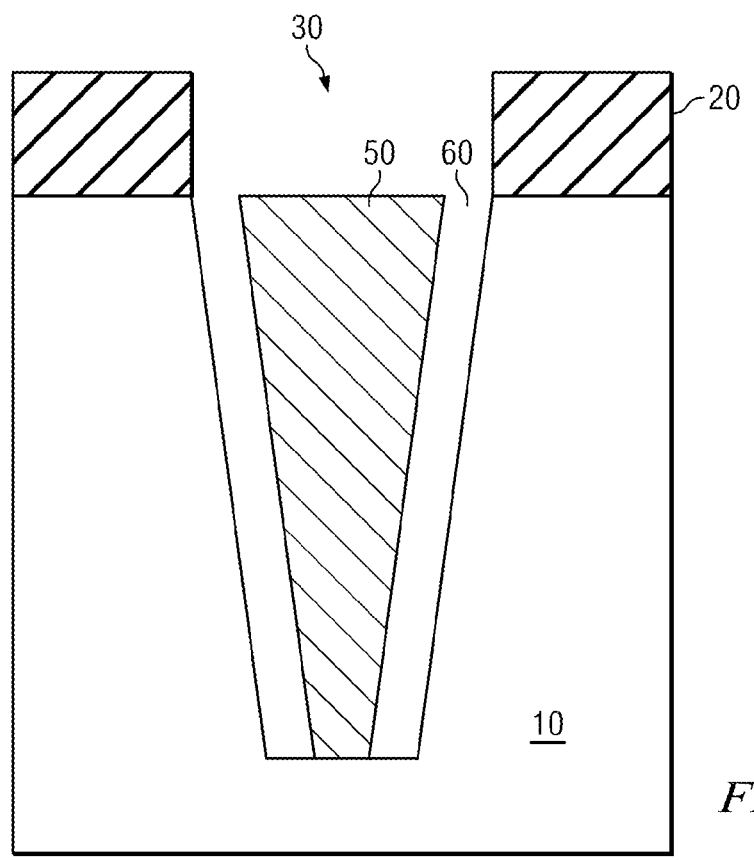
Figure 5D:
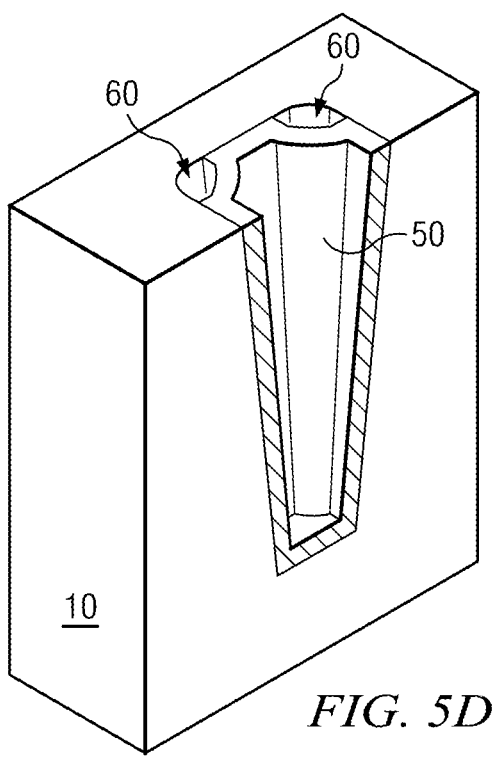

FIG. 5, which includes FIGS. 5A-5D, illustrates the semiconductor device during fabrication after removing the first epitaxial layer in various embodiments of the invention, wherein FIG. 5A illustrates a top view, wherein FIGS. 5B and 5C illustrate cross-sectional views, and FIG. 5D illustrates a projection view.

As illustrated in FIGS. 5A and 5C, the epitaxial layer 40 is removed. Advantageously, the epitaxial layer 40 is a different material than the substrate 10 and the first conductive material 50. Therefore, the epitaxial layer 40 may be removed without removing the material from the substrate 10 or the first conductive material 50. In one or more embodiments, the epitaxial layer 40 is removed using a wet etching process. In one embodiment, when the epitaxial layer 40 is silicon germanium, the epitaxial layer 40 is removed using a wet solution, containing HF, $H_2O_2$, acetic acid, and water as the etchant.

In one or more embodiments the upper surface of the epitaxial layer 40 may be covered by the first conductive material 50. In such embodiments, an additional chemical mechanical polishing (CMP) may be performed prior to the wet etching process to remove the overlying first conductive material 50. In some embodiments, prior to the CMP, the unfilled central portion of the opening 30 is temporarily sealed with the deposition of a non-conformal layer. This temporary seal prevents the CMP-slurry to enter the central portion of the opening 30. The temporary seal is removed during or after the etching of the epitaxial layer 40.

As illustrated in FIGS. 5A and 5C, a gap 60 is formed within the opening 30 after the removal of the epitaxial layer 40. While, the structure in this stage of processing has multiple openings (gap 60), the structure is mechanically stable because the first conductive layer 50 is contacting the sidewalls of the opening as in FIG. 5B. Therefore, the remaining layers of the capacitor may be fabricated without danger of collapse of the thin structures (see pillar like structures in FIG. 5C).

Figure 6A:
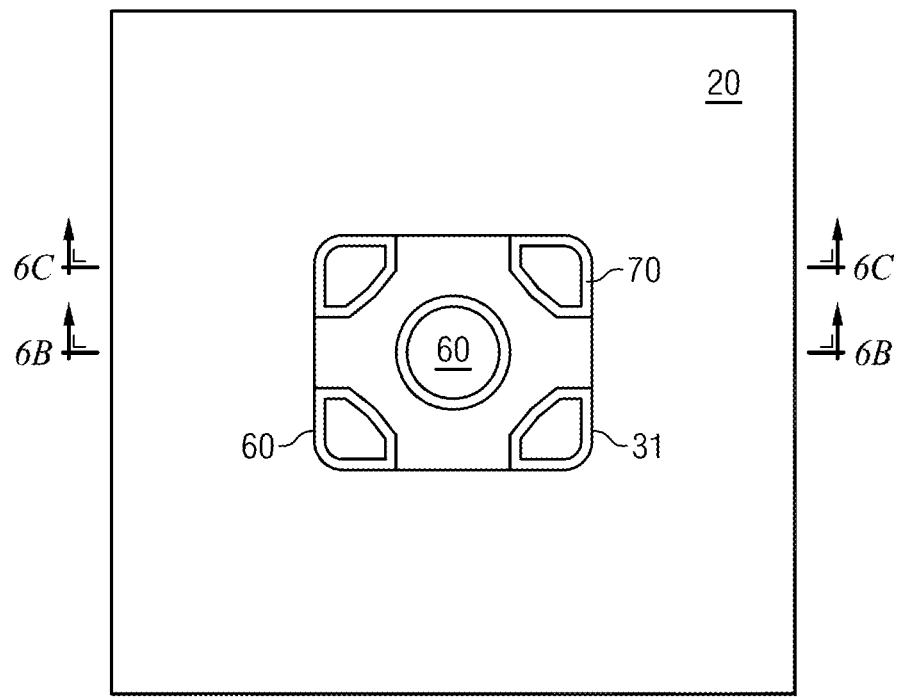
Figure 6B:
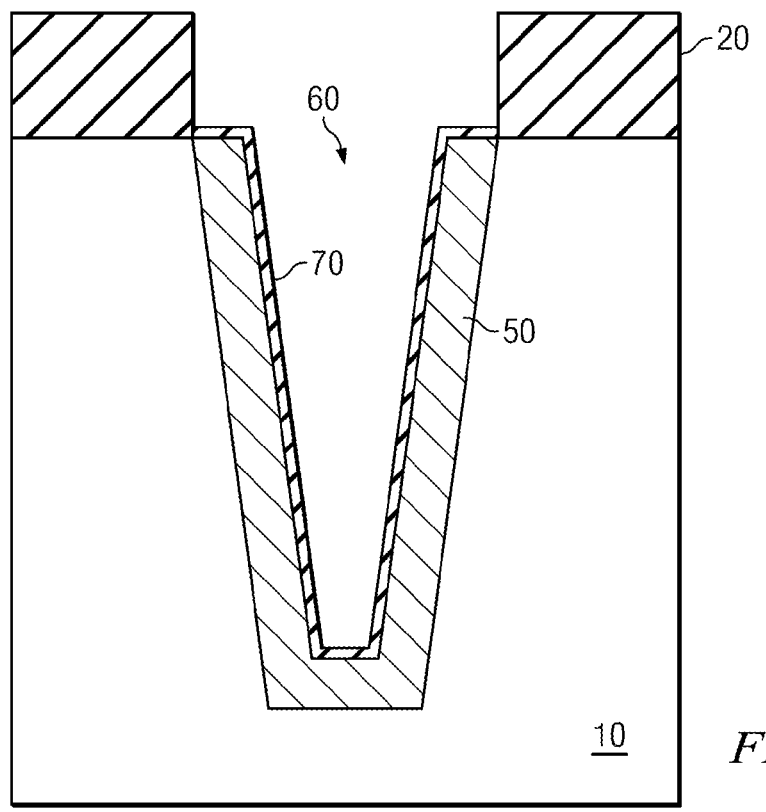
Figure 6C:
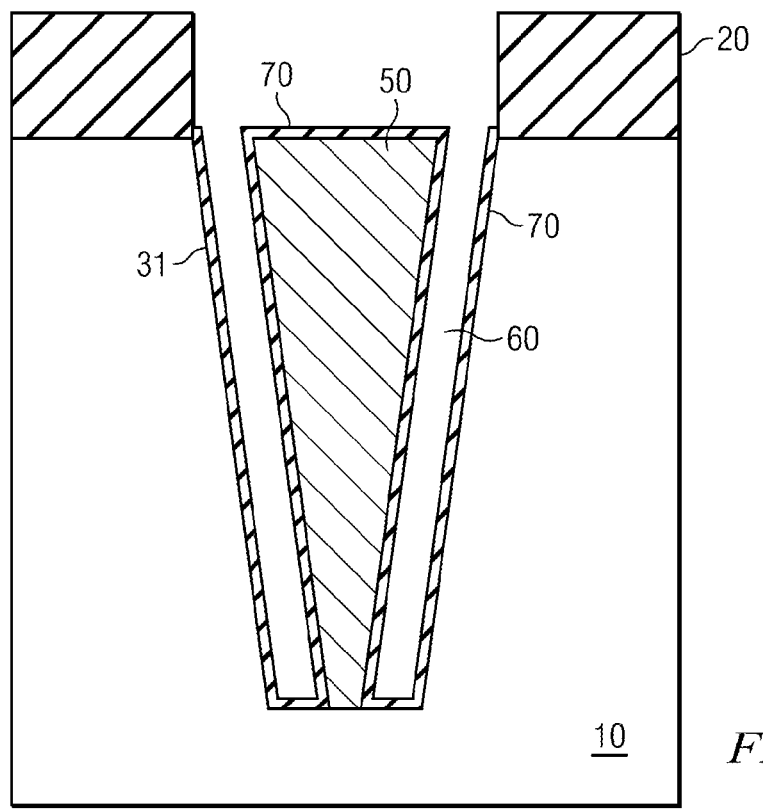

FIG. 6, which includes FIGS. 6A-6C, illustrates the semiconductor device during fabrication after forming a capacitor dielectric layer in various embodiments of the invention, wherein FIG. 6A illustrates a top view, wherein FIGS. 6B and 6C illustrate cross-sectional views.

A dielectric layer 70 is formed over the top surface of the substrate 10 as well as within the opening 30. The dielectric layer 70 may be formed over the sidewalls of the gap 60 and the exposed portion of bottom surface of the gap 60. As a consequence, the dielectric layer 70 may be formed over the surfaces of the first conductive material 50 (FIG. 6B) and the sidewalls 31 of the opening 30 around the edges (FIG. 6C).

In various embodiments, the dielectric layer 70 is deposited or grown. In one or more embodiments, the deposition process is a substantially conformal deposition process. In one embodiment, the dielectric layer 70 is formed using an atomic layer deposition process. In another embodiment, the dielectric layer is formed using an oxidation process.

In various embodiments, the dielectric layer 70 has a thickness of about 1 nm to about 50 nm, and about 10 nm to about 20 nm in one embodiment. The dielectric layer 70 may be an oxide, nitride, oxynitride, or a high-k dielectric in various embodiments.

Figure 7A:
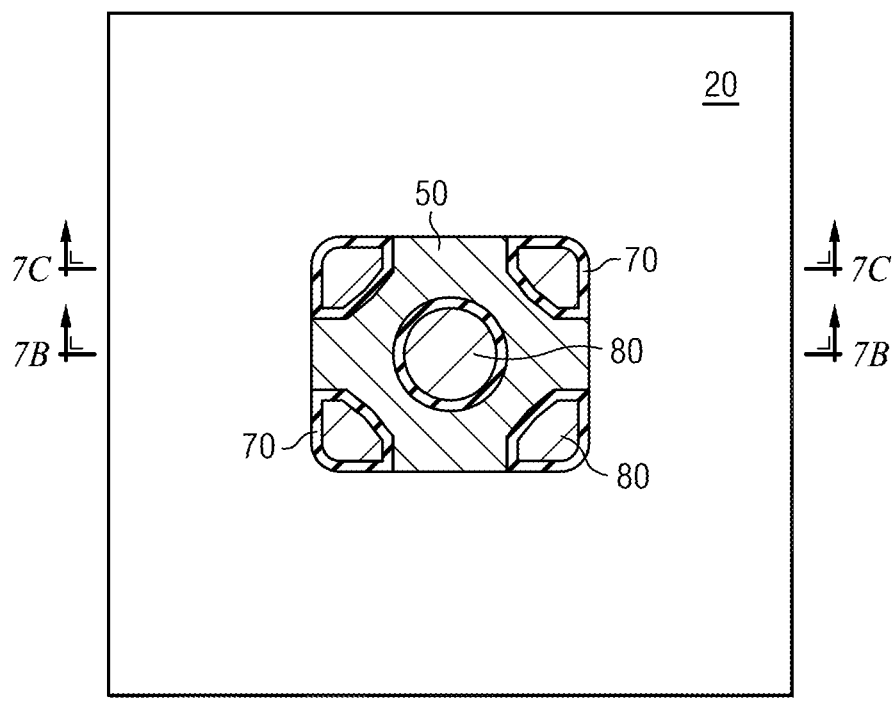
Figure 7B:
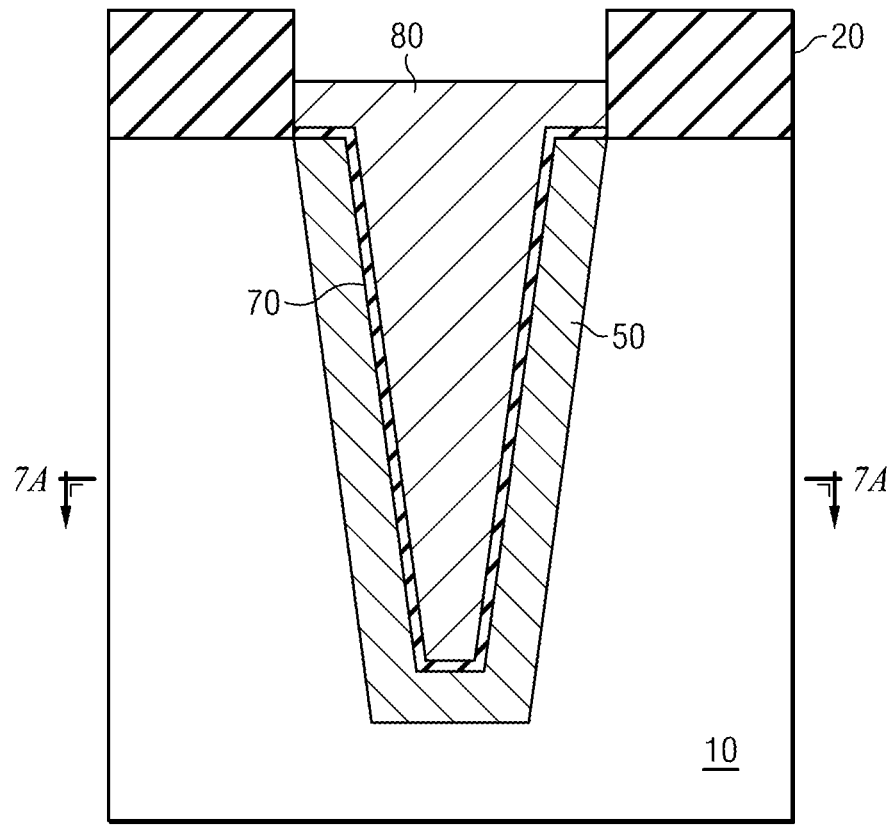
Figure 7C:
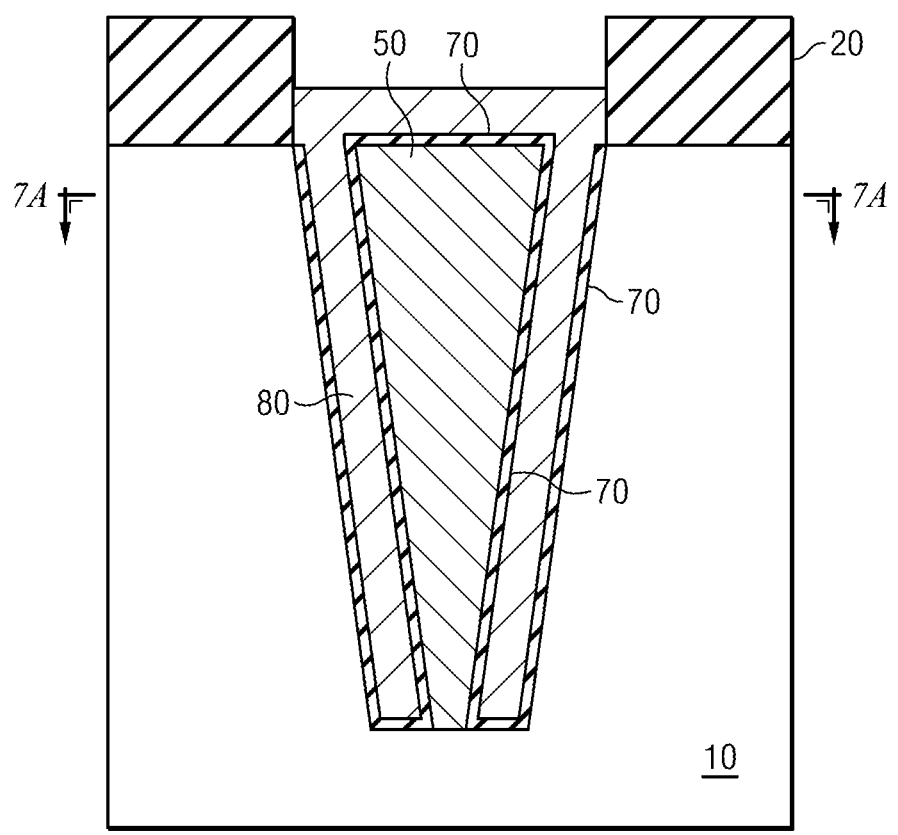

FIG. 7, which includes FIGS. 7A-7C, illustrates the semiconductor device during fabrication after forming a second electrode over the capacitor dielectric layer in various embodiments of the invention, wherein FIG. 7A illustrates a top view, wherein FIGS. 7B and 7C illustrate cross-sectional views.

A second conductive material 80 is deposited over the dielectric layer 70. In various embodiments, the second conductive material 80 may comprise any conductive material.

In one or more embodiments, the second conductive material 80 may comprise a poly-silicon, which may be doped either p-type or n-type. The second conductive material 80 may be doped in-situ or later by ion-implantation.

Alternatively, in one or more embodiments, the second conductive material 80 may comprise a metallic material such as a pure metal or a metal alloy. In some embodiments, the second conductive material 80 may also be a composite or heterogeneous mixture of two or more conductive materials. The second conductive material 80 may be formed as a layered stack of two or more layers (e.g., sub-layers of the second conductive material 80). Each layer (e.g., sub-layer of the second conductive material 80) of the stack may comprise a different conductive material.

In one or more embodiments, the second conductive material 80 may be deposited or grown in a conductive state. In one or more embodiments, the second conductive material 80 may not be deposited or grown in a conductive state. Instead, the second conductive material 80 may be made conductive (for example, by a doping process) after it is deposited or grown. For example, an un-doped poly-silicon material may be deposited and subsequently doped by an ion-implantation and annealing process.

In various embodiments, the second conductive material 80 may be over-filled over the opening 30 to facilitate subsequent contact formation and to couple all portions of the second electrode together. However, care must be taken to avoid shorting of the second conductive material 80 to the substrate 10.

Subsequent processing continues as in convention fabrication. For example, contacts are made to the second conductive material 80. For example, if the second conductive material 80 comprises poly-silicon, a silicide may be formed on the second conductive material 80. Further, contacts are made to the first conductive material 50. The hard mask layer 20 may be removed after the formation of the capacitor.

FIG. 8, which includes FIGS. 8A-8D, illustrates another embodiment of the invention for forming the capacitor.

This embodiment follows the prior embodiment described in FIG. 2. Unlike the prior embodiment, here the epitaxial layer 40 preferentially forms in a central portion of the sidewalls of the opening 30 and is inhibited in corner regions. In one embodiment, the growth rate of the epitaxial layer 40 in a direction parallel to the sidewalls of the opening 30 is higher, or for other reasons, the growth of the epitaxial layer 40 along the edges of the sidewalls is inhibited.

For example, epitaxial silicon germanium may grow faster along {100} planes than {110} planes. So when the sidewalls of the opening 30 are oriented along <010> directions, the growth may be preferred along the central portions of the sidewalls than the corners, which require the formation of other planes.

Figure 8A:
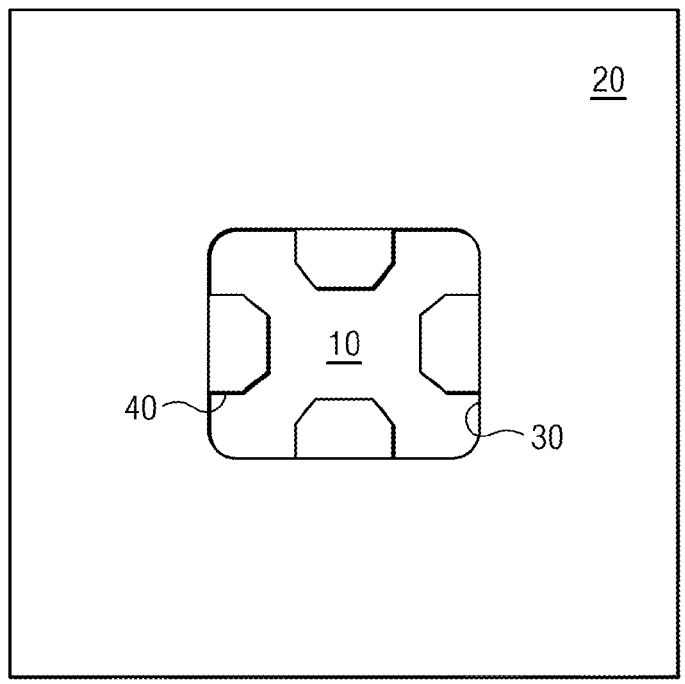
FIGS. 8A-8D, illustrates another embodiment of the invention for forming the capacitor.

Consequently, referring to FIG. 8A, the epitaxial layer 40 is formed only in central portions of the sidewalls of the opening 30.

Figure 8B:
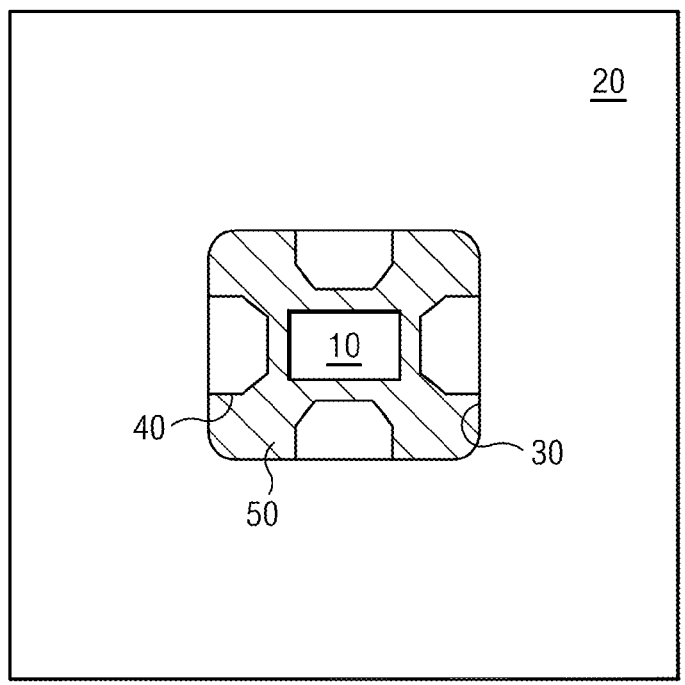

Next, as illustrated in FIG. 8B, a first conductive material 50 is formed within the opening 30 leaving a central opening as in prior embodiments. The first conductive material 50 grows faster on the sidewalls of the opening 30 than on the epitaxial layer 40 as in the prior embodiment.

Figure 8C:
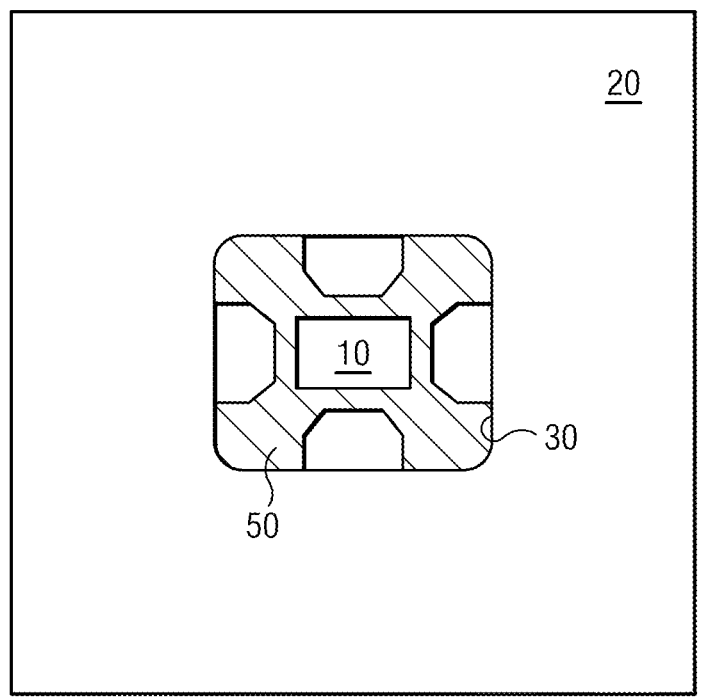
Figure 8D:
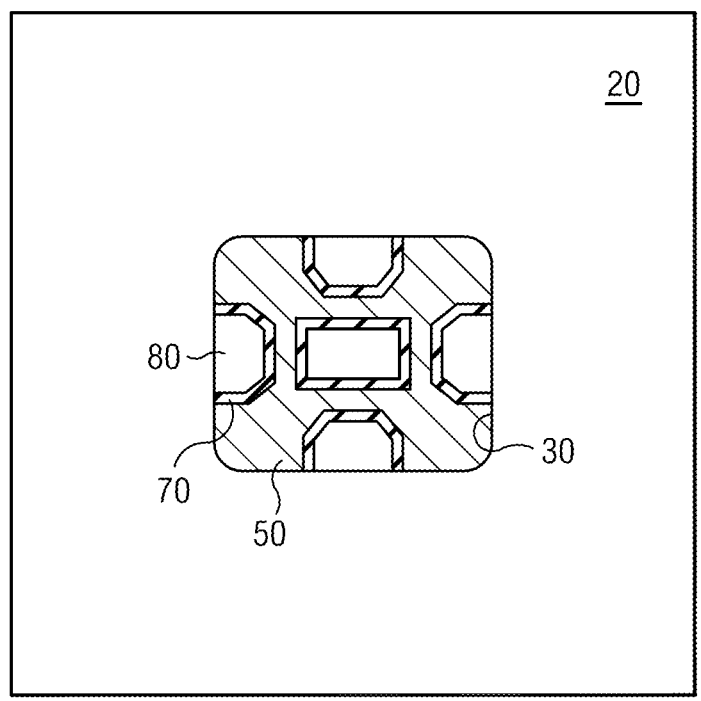

Referring to FIG. 8C, the epitaxial layer 40 is etched and removed without removing the first conductive material 50. As next illustrated in FIG. 8D, a dielectric layer 70 and a second conductive material 80 are deposited, for example, as described previously. Thus, in this embodiment, the pillar like structures with second conductive material 80 are formed in central portions of the opening 30 unlike the corners in the prior embodiment.

Figure 9A:
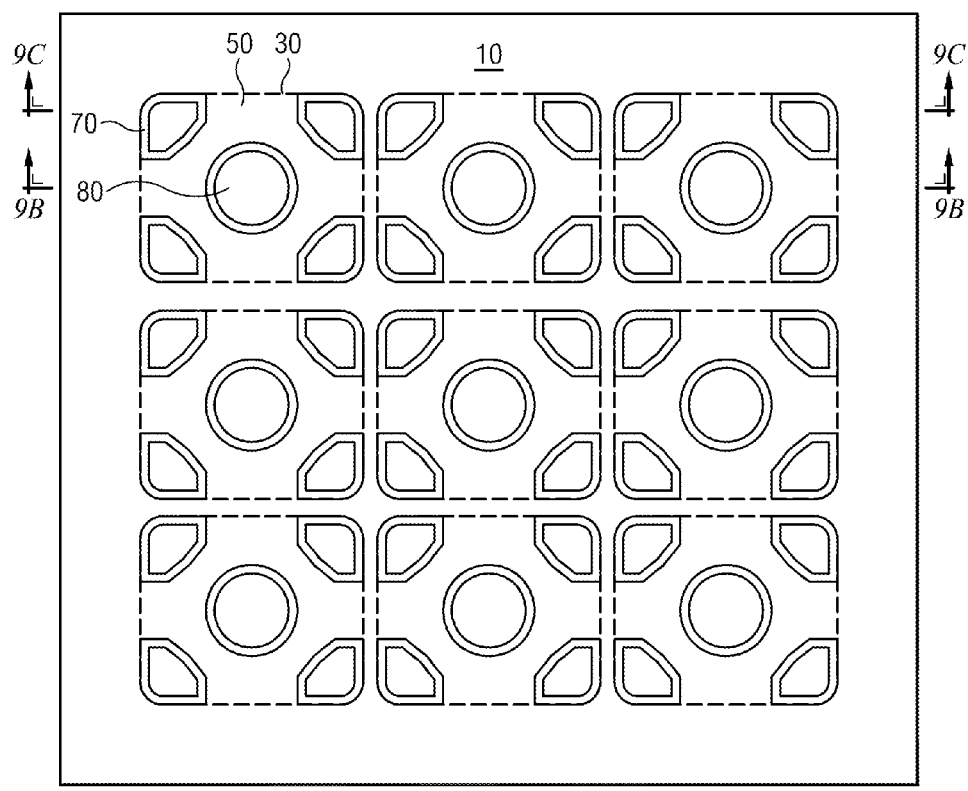
Figure 9B:
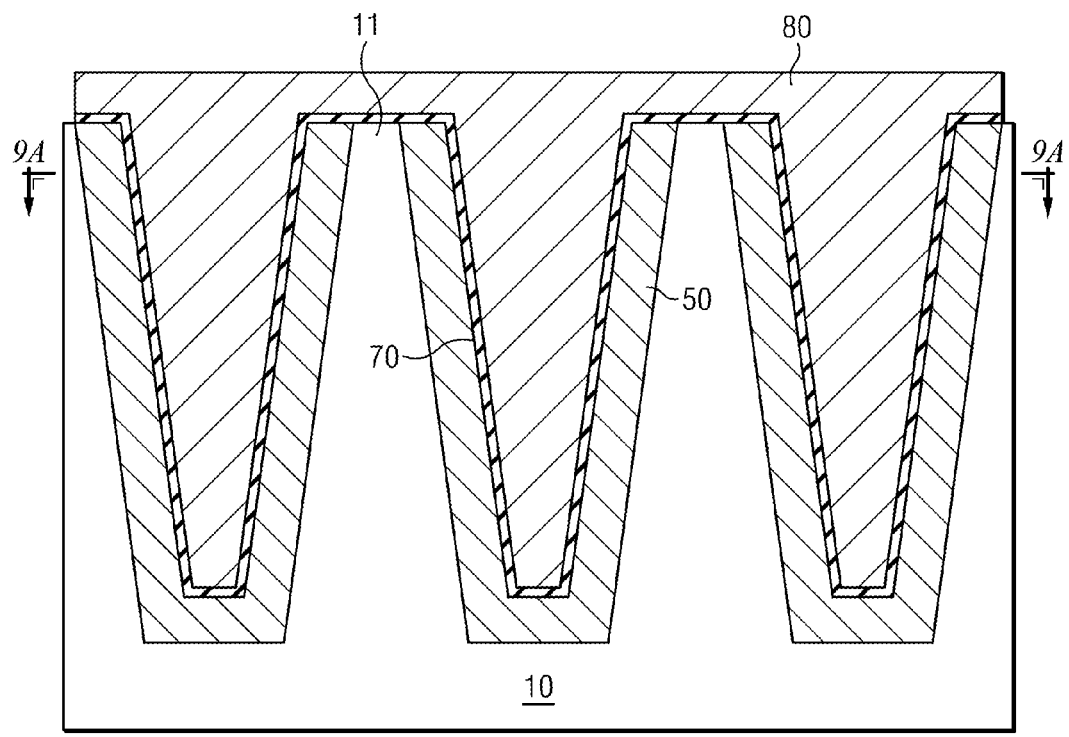
Figure 9C:
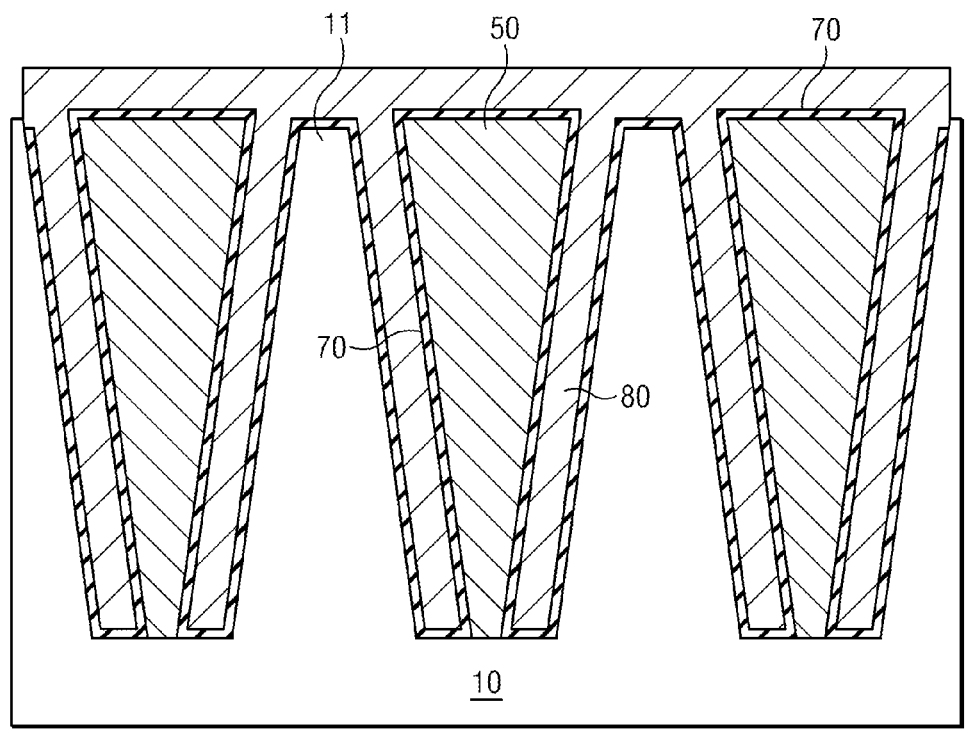

FIG. 9, which includes FIGS. 9A-9C, illustrates an alternative embodiment of the invention showing a plurality of capacitor structures formed adjacent each other, wherein FIG. 9A illustrates a top view and FIGS. 9B and 9C illustrate cross-sectional views. Each of the individual capacitor is similar to the various embodiments of the capacitor discussed in FIGS. 1-8, and 10. However, advantageously, the over-filled second conductive material 80 may be used to couple between the adjacent capacitors. The dielectric layer 70 separates the second conductive material 80 from the substrate 10 in substrate regions 11 (FIGS. 9B and 9C) between the adjacent capacitors.

Figure 10A:
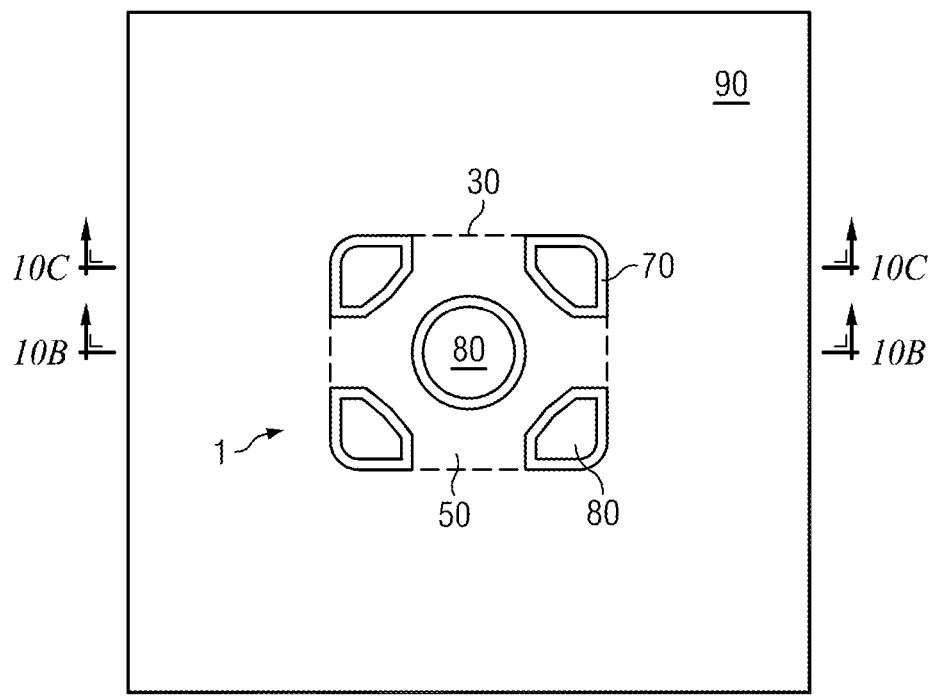
Figure 10B:
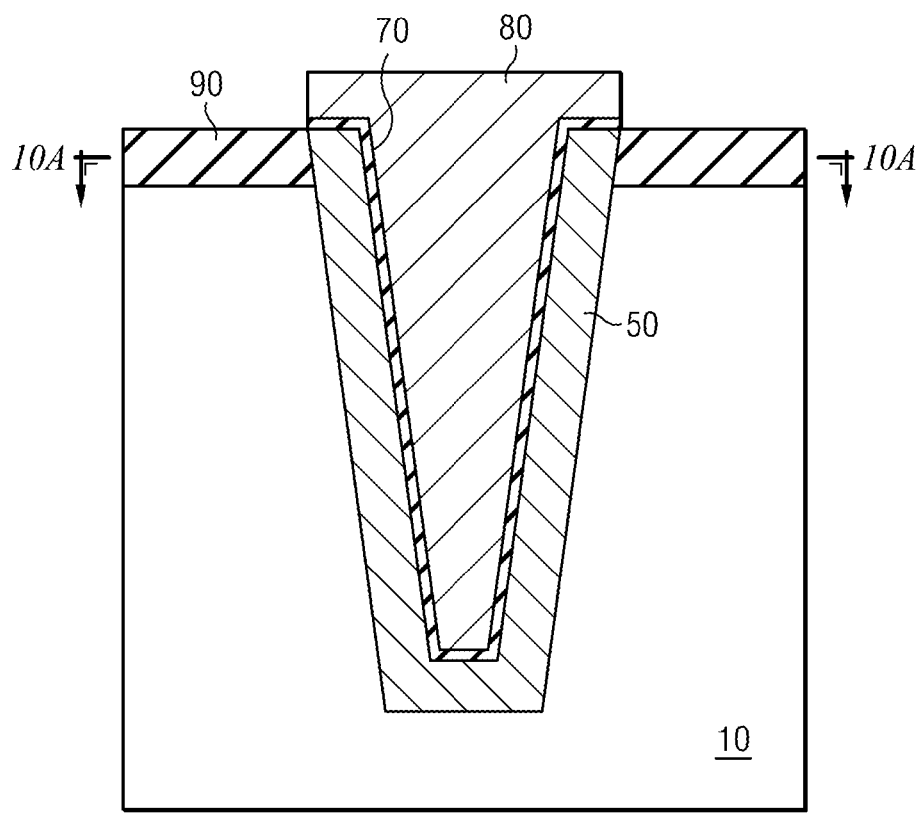
Figure 10C:
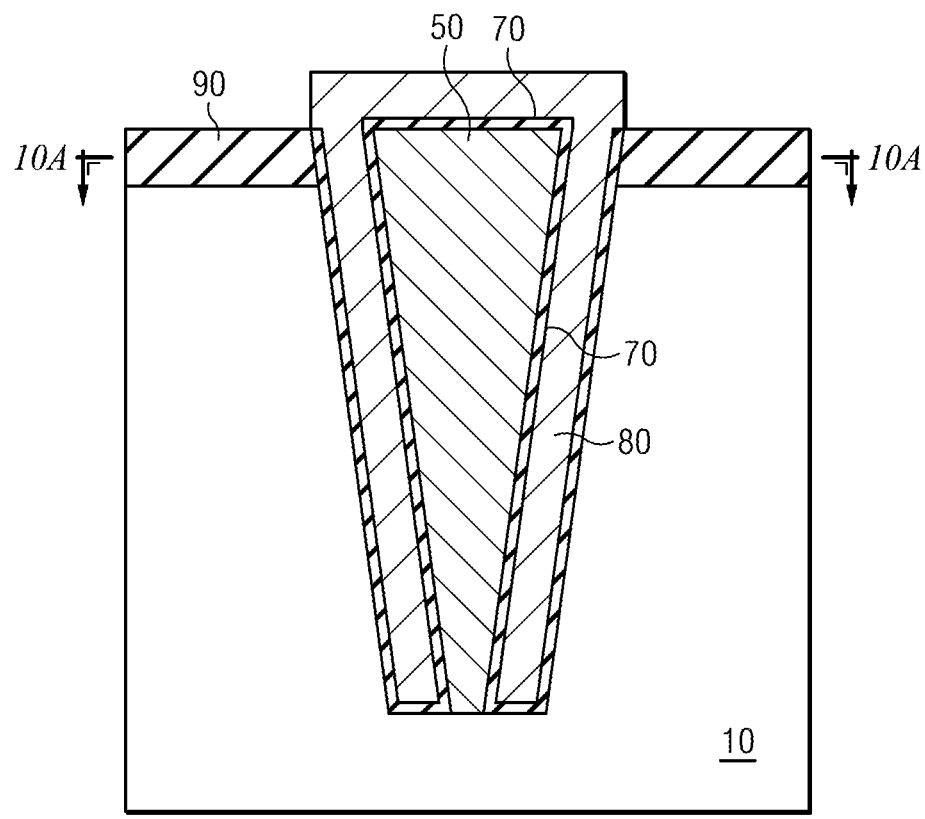

FIG. 10, which includes FIGS. 10A-10C, illustrates an embodiment of the invention with an additional protective layer, wherein FIG. 10A illustrates a top view, and FIGS. 10B and 10C illustrate cross-sectional views.

This embodiment is similar to the embodiment of FIG. 1 except for the additional protective layer 90. The protective layer 90 helps to avoid shorting between the second conductive material 80 and the first conductive material 50 or between the second conductive material 80 and the substrate 10. The protective layer 90 may be formed prior to forming the opening in various embodiments.

Figure 11:
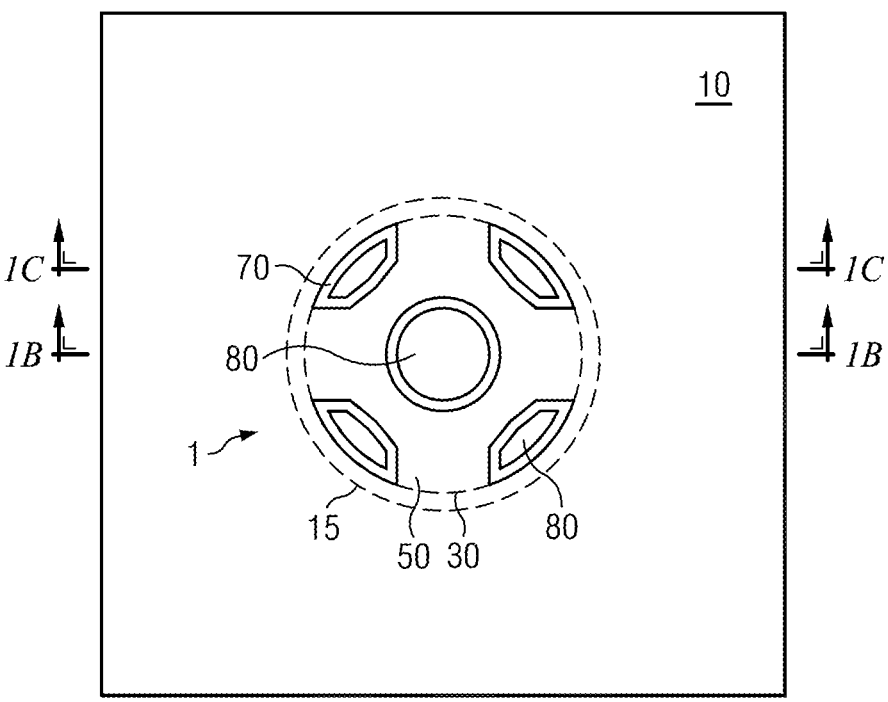
FIG. 11 illustrates a top view of a trench capacitor in an alternative embodiment of the invention.

FIG. 11 illustrates a top view of a trench capacitor in an alternative embodiment of the invention.

Similar to the embodiment described previously, for example, in FIG. 1, a first conductive material 50 is disposed in an opening 30. A central portion of the opening 30 and portions of the periphery of the opening 30 are not filled with the first conductive material 50. Rather, these regions are filled with a second conductive material 80. The first and the second conductive materials 50 and 80 are separated by the dielectric layer 70. As in the prior embodiments, the first conductive material 50 forms the first electrode of a capacitor 1, the second conductive material 80 forms the second electrode of the capacitor 1, and the dielectric layer 70 forms the capacitor dielectric.

Unlike the prior embodiments, the top view of the opening 30 is circular or elliptical. This may happen intentionally wherein the hard mask forming the opening 30 is patterned in such a shape or inherently due to the process, e.g., when the substrate 10 may be progressively be etched in circular shape although the hard mask is shaped in a square or rectangular shape. Such smoothing of the shape from a square, rectangle, trapezoid to a circular or elliptical shape may occur due to the etching process.

Although the opening 30 is circular in shape, all processes described in earlier embodiments, for example, FIGS. 2-8 may be performed in a similar manner. For example, because of the difference in growth along different directions, the epitaxial layer 40 has a different growth along different planes forming the structure similar to that in FIG. 3. Consequently, similar processing may be performed forming the trench capacitor 1 having a circular top view. The cross-sectional views are not shown as they may be similar to FIG. 1.

Embodiments of the invention various combination including the combination of FIG. 11 with the embodiments of FIG. 1, FIGS. 2-7, FIG. 8, FIG. 9, and/or FIG. 10.

Figure 12:
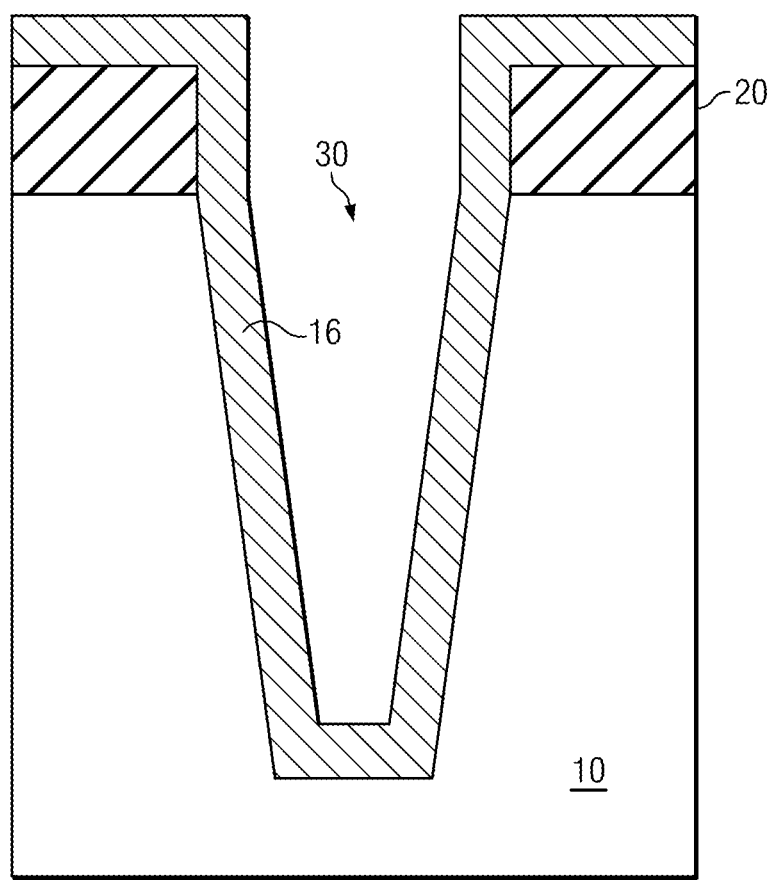
FIGS. 12-13 illustrates a method of fabricating a trench capacitor in accordance with an alternative embodiment of the invention.
Figure 13:
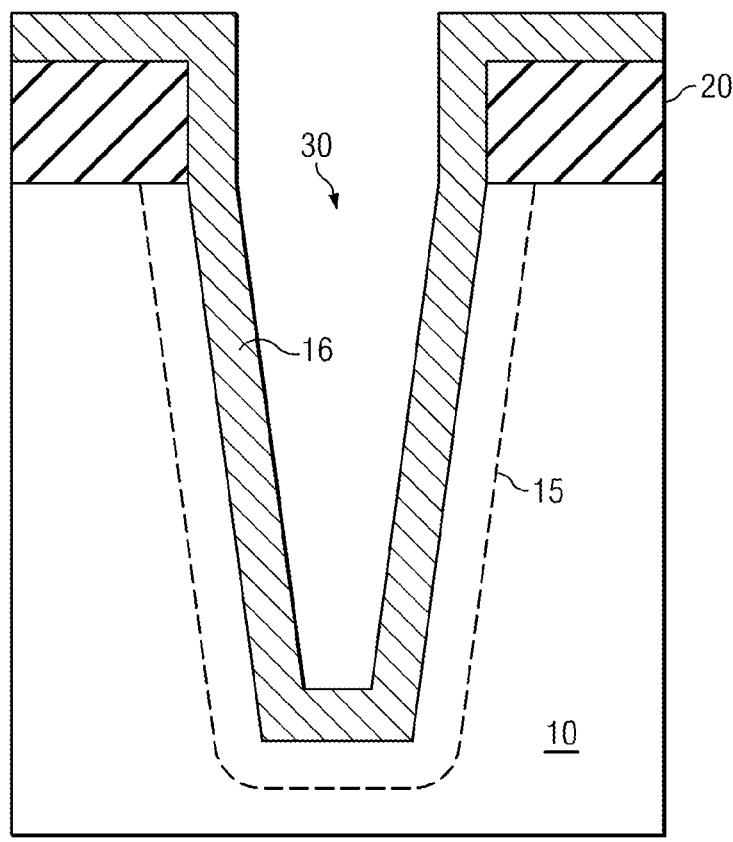

FIGS. 12-13 illustrates a method of fabricating a trench capacitor in accordance with an alternative embodiment of the invention. This embodiment may be combined with any of the prior embodiments, for example, FIGS. 2-7 or FIG. 8.

FIGS. 12-13 illustrate an embodiment of forming a doped region 15 within the opening 30. Unlike the prior embodiment described with respect to FIG. 2, a doped layer 16 may be deposited over the opening 30. In various embodiments, the doped layer 16 may comprise dopants such as arsenic, boron, phosphorus. The doped layer 16 may be deposited as a liner or may simply fill the trench partially or fully. The doped layer 16 may comprise a glass or an oxide in one embodiment. In one embodiment, the doped layer 16 is a borosilicate gate or phosphosilicate glass. After depositing the doped layer 16, an annealing step may be performed. The annealing step provides thermal energy for the dopants within the doped layer 16 to diffuse into the substrate 10. After the annealing, the doped layer 16 may be removed. Further processing may continue as in prior embodiments.

Figure 14:
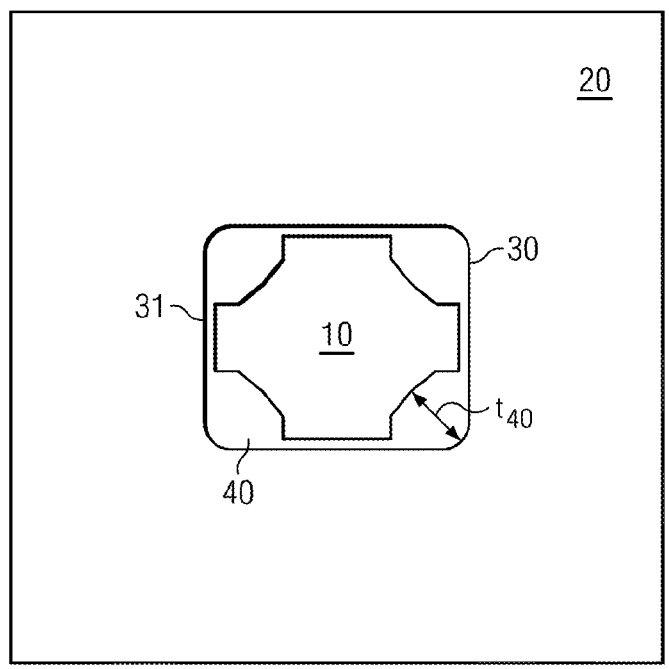
FIG. 14 illustrates an embodiment of forming the epitaxial layer in which the epitaxial layer grows on all parts of the sidewall.

FIG. 14 illustrates an embodiment of forming the epitaxial layer in which the epitaxial layer grows on all parts of the sidewall. This embodiment follows the process described in FIGS. 2-3. However, as described earlier, the epitaxial layer 40 may grow on all sidewalls of the opening 30. However, because of the difference in growth rate in different directions, the epitaxial layer 40 may grow non-uniformly on different planes. One such example embodiment is shown in FIG. 14. If a thin layer of the epitaxial layer 40 forms on other parts of the sidewall 31, an isotropic wet chemical etch may be used to separate the epitaxial layer 40 in these four directions from each other. Thus, forming the structure shown in FIG. 3. Further processing continues as described earlier in FIGS. 4-7. This embodiment may be combined with any of the other embodiments, for example, FIG. 8, FIG. 9, FIG. 10, FIG. 11, and/or FIGS. 12-13.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a substrate having an opening comprising a first sidewall;
a central pillar disposed in a central region of the opening, the central pillar comprising a first electrode material;
a first dielectric layer disposed around the central pillar;
a second electrode material disposed around the first dielectric layer, the second electrode material contacting a first portion of the first sidewall;
a peripheral pillar disposed in a periphery region of the opening, the peripheral pillar electrically coupled to the central pillar; and
a second dielectric layer disposed around the peripheral pillar, the second dielectric layer contacting a second portion of the first sidewall.

2. The device of claim 1, wherein the central pillar and the peripheral pillar form part of a first electrode of a trench capacitor, the first and the second dielectric layers form part of a capacitor dielectric of the trench capacitor, and the second electrode material form part of a second electrode of the trench capacitor.

3. The device of claim 1, wherein the peripheral pillar comprises the first electrode material.

4. The device of claim 1, wherein the second electrode material is disposed partially around the second dielectric layer.

5. The device of claim 1, wherein the peripheral pillar has a faceted shape.

6. The device of claim 5, wherein the peripheral pillar has a sidewall oriented along a {100} or a {110} crystal plane of the substrate.

7. The device of claim 1, wherein the central pillar has a faceted shape.

8. The device of claim 1, wherein the first portion of the first sidewall is a central portion of the first sidewall, and wherein the second portion of the first sidewall is nearer to an edge of the first sidewall than the first portion.

9. The device of claim 1, wherein the first portion of the first sidewall is nearer to an edge of the first sidewall than the second portion, and wherein the second portion of the first sidewall is a central portion of the first sidewall.

10. The device of claim 1, wherein the opening comprises a second sidewall, the second sidewall being perpendicular to the first sidewall.

11. The device of claim 1, wherein the substrate is capacitively coupled through the second portion of the first sidewall.

12. The device of claim 1, further comprising a doped region disposed in the substrate around the opening.

13. The device of claim 1, wherein the substrate comprises silicon, and the second electrode material comprises mono-crystalline silicon.

14. A semiconductor device comprising:
a semiconductor substrate having an opening comprising a first sidewall;
a central pillar disposed in a central region of the opening, the central pillar comprising a first electrode material;
a first dielectric layer disposed around the central pillar;
a second electrode material disposed around the first dielectric layer, the second electrode material contacting a first portion of the first sidewall but not contacting all of the first sidewall; and
a peripheral pillar comprising a semiconductor material of the semiconductor substrate disposed in a periphery region of the opening, the peripheral pillar electrically coupled to the central pillar.

15. The device of claim 14, further comprising:

a second dielectric layer disposed around the peripheral pillar, the second dielectric layer contacting a second portion of the first sidewall, wherein the second electrode material covers a remaining portion of the second dielectric layer.

16. The device of claim 15, wherein a sidewall of the peripheral pillar is oriented along a {100} or a {110} crystal plane of the semiconductor substrate.

17. The device of claim 14, wherein the substrate comprises silicon, and the second electrode material comprises mono-crystalline silicon.

18. A semiconductor device comprising:

an opening comprising a first sidewall disposed in a substrate;

a central pillar disposed in a central region of the opening, the central pillar comprising a first electrode material;

a first dielectric layer disposed around the central pillar;

a second electrode material disposed around the first dielectric layer, the second electrode material contacting a first portion of the first sidewall but not contacting all of the first sidewall; and a peripheral pillar disposed in a periphery region of the opening, the peripheral pillar electrically coupled to the central pillar.

19. The device of claim 18, further comprising a second dielectric layer disposed around the peripheral pillar, the second dielectric layer contacting a second portion of the first sidewall, wherein the second electrode material covers a remaining portion of the second dielectric layer.

20. The device of claim 18, wherein a sidewall of the peripheral pillar is oriented along a {100} or a {110} crystal plane of the substrate.

21. The device of claim 18, wherein the substrate comprises silicon, and the second electrode material comprises mono-crystalline silicon.

* * * * *